(12) United States Patent
Oura

(10) Patent No.: US 8,701,902 B2
(45) Date of Patent: Apr. 22, 2014

(54) RACK MOUNT DEVICE

(75) Inventor: Norihiro Oura, Tokyo (JP)

(73) Assignee: NEC Corporation, Tokyo (JP)

( * ) Notice: Subject to any disclaimer, the term of this patent is extended or adjusted under 35 U.S.C. 154(b) by 336 days.

(21) Appl. No.: 12/545,231

(22) Filed: Aug. 21, 2009

(65) Prior Publication Data

US 2010/0051569 A1 Mar. 4, 2010

(30) Foreign Application Priority Data

Sep. 2, 2008 (JP) .................................. 2008-225115

(51) Int. Cl.
*A47B 43/00* (2006.01)
*A47F 7/00* (2006.01)
*A47F 5/00* (2006.01)
*A47B 88/00* (2006.01)

(52) U.S. Cl.
USPC ........ 211/192; 211/26; 248/298.1; 312/334.3

(58) Field of Classification Search
USPC .............. 211/26, 189, 191, 192, 126.15, 175; 312/334.4, 334.5, 223.1, 265.1–265.4; 248/298.1, 220.21, 222.11, 222.13
See application file for complete search history.

(56) References Cited

U.S. PATENT DOCUMENTS

| 3,612,290 | A | * | 10/1971 | Evans | 211/192 |
| 3,986,318 | A | * | 10/1976 | McConnell | 403/384 |
| 4,002,398 | A | * | 1/1977 | Hanisch et al. | 439/713 |
| 4,029,038 | A | * | 6/1977 | Pfahl | 114/162 |
| 4,165,944 | A | * | 8/1979 | Sunasky | 403/254 |
| 4,181,382 | A | * | 1/1980 | Harvey | 312/245 |
| 4,467,729 | A | * | 8/1984 | Featherman | 108/107 |
| 4,779,515 | A | * | 10/1988 | Staub, Jr. | 92/128 |
| 4,955,743 | A | * | 9/1990 | King | 403/254 |
| 5,025,937 | A | * | 6/1991 | King | 211/192 |
| 6,042,076 | A | * | 3/2000 | Moreno | 248/467 |
| 6,241,109 | B1 | * | 6/2001 | Kautz et al. | 211/192 |
| 6,373,707 | B1 | * | 4/2002 | Hutchins | 361/725 |

(Continued)

FOREIGN PATENT DOCUMENTS

| GB | 2353205 A | 2/2001 |
| JP | 61-109189 A | 7/1986 |

(Continued)

OTHER PUBLICATIONS

Japanese Office Action for JP 2008-225115 mailed on May 15, 2012.

*Primary Examiner* — Joshua J Michener
*Assistant Examiner* — Devin Barnett
(74) *Attorney, Agent, or Firm* — Sughrue Mion, PLLC

(57) ABSTRACT

To be able to connect and mount a rack mount device having a rack loaded device loaded thereon to a rack easily, and to be able to release and detach the rack mount device easily from the outside of the rack. The rack mount device has a pair of mount kits for holding the rack loaded device arranged to oppose to each other, which are detachably connected to four mount angles configuring the rack. Each mount kit is configured with a front mount and a rear mount, which are freely slidable with respect to each other in the longitudinal directions thereof. A kit connecting mechanisms for connecting each mount kit to the mount angles are provided to both ends of the mount kits, respectively. A connection releasing mechanism for releasing the connection between the mount kits and the mount angles is provided to each of the kit connecting mechanisms.

2 Claims, 19 Drawing Sheets

(56) References Cited

U.S. PATENT DOCUMENTS

| | | | |
|---|---|---|---|
| 6,609,619 B2* | 8/2003 | Abbott | 211/26 |
| 6,796,625 B2* | 9/2004 | Lauchner et al. | 312/334.46 |
| 6,935,521 B2* | 8/2005 | Gundlach et al. | 211/183 |
| 7,014,155 B1* | 3/2006 | Schnabel et al. | 248/224.8 |
| 7,014,282 B2* | 3/2006 | Hammerle | 312/334.4 |
| 7,036,783 B2* | 5/2006 | Chen et al. | 248/298.1 |
| 7,144,184 B1* | 12/2006 | Tsai | 403/350 |
| 7,542,271 B2* | 6/2009 | Chen et al. | 361/679.33 |
| 7,552,899 B2* | 6/2009 | Chen et al. | 248/224.8 |
| 7,703,734 B2* | 4/2010 | Chen et al. | 248/298.1 |
| 7,798,581 B2* | 9/2010 | Chen et al. | 312/265.1 |
| 8,079,654 B2* | 12/2011 | Yu et al. | 312/334.4 |
| 2001/0040203 A1* | 11/2001 | Brock et al. | 248/222.11 |
| 2002/0027116 A1* | 3/2002 | Herzog et al. | 211/192 |
| 2002/0084734 A1* | 7/2002 | Shih | 312/334.4 |
| 2003/0106863 A1* | 6/2003 | Lauchner et al. | 211/26 |
| 2003/0111436 A1* | 6/2003 | Basinger et al. | 211/183 |
| 2003/0205539 A1* | 11/2003 | Lauchner et al. | 211/26 |
| 2004/0041502 A1* | 3/2004 | Lauchner | 312/334.5 |
| 2004/0217073 A1* | 11/2004 | Dobler et al. | 211/26 |
| 2005/0212390 A1* | 9/2005 | Silvestro et al. | 312/334.4 |
| 2005/0274680 A1* | 12/2005 | Allen et al. | 211/26 |
| 2006/0157436 A1* | 7/2006 | Iwamoto | 211/191 |
| 2007/0039913 A1* | 2/2007 | Chen | 211/192 |
| 2008/0018213 A1* | 1/2008 | Chen et al. | 312/334.4 |
| 2008/0035588 A1* | 2/2008 | Liang | 211/26 |
| 2008/0087781 A1* | 4/2008 | Chen et al. | 248/224.8 |
| 2008/0203251 A1* | 8/2008 | Chen et al. | 248/200 |
| 2008/0230496 A1* | 9/2008 | Henderson et al. | 211/26 |
| 2011/0100934 A1* | 5/2011 | Hsu | 211/26 |
| 2011/0100936 A1* | 5/2011 | Chang et al. | 211/26 |
| 2011/0192946 A1* | 8/2011 | Yu et al. | 248/222.11 |
| 2011/0290746 A1* | 12/2011 | Lu | 211/26 |

FOREIGN PATENT DOCUMENTS

| | | |
|---|---|---|
| JP | 3-067476 A | 7/1991 |
| JP | 2003159129 A | 6/2003 |
| JP | 2000332877 A | 11/2003 |
| JP | 2006202792 A | 8/2006 |
| JP | 2008103486 A | 5/2008 |

* cited by examiner

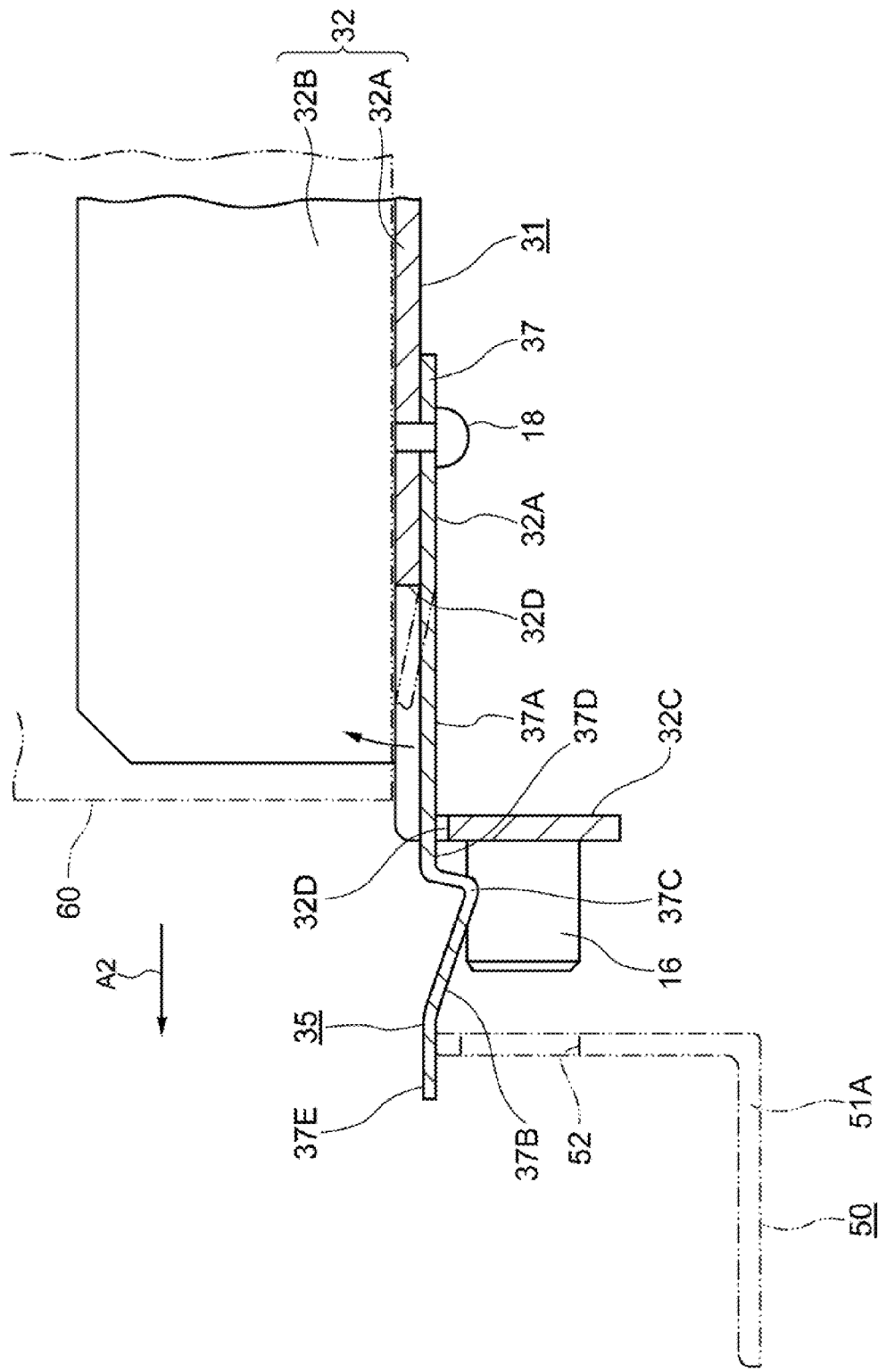

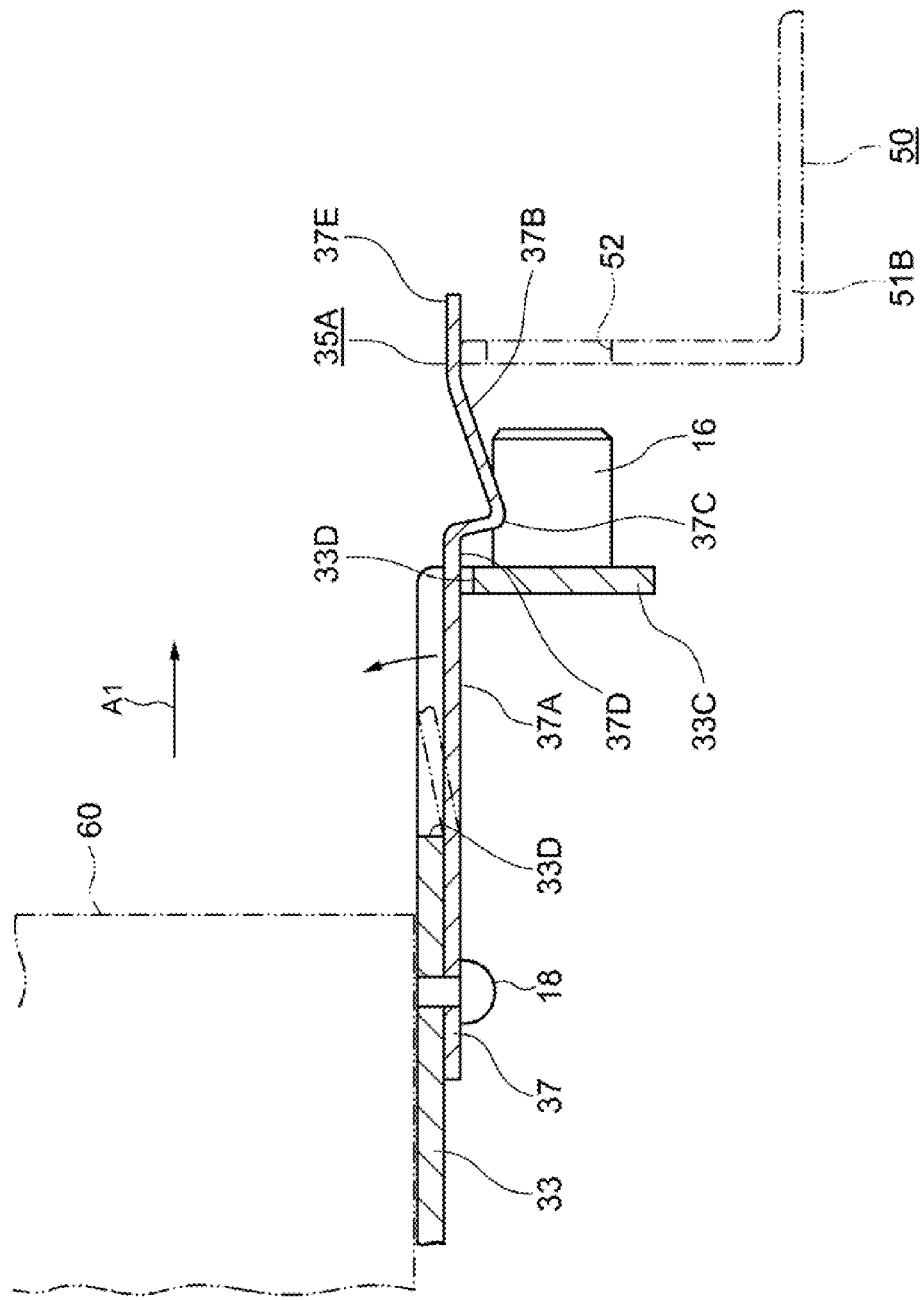

RACK MOUNT DEVICE

CROSS-REFERENCE TO RELATED APPLICATION

This application is based upon and claims the benefit of priority from Japanese patent application No. 2008-225115, filed on Sep. 2, 2008, the disclosure of which is incorporated herein in its entirety by reference.

BACKGROUND OF THE INVENTION

1. Field of the Invention

The present invention relates to a rack mount device and, more specifically, to a rack mount device equipped with a rack loaded device such as an electronic device and the like, which can be easily connected and released to/from a rack.

2. Description of the Related Art

Recently, IT device systems and NW device systems have rack loaded devices suited for designated functions loaded on a plurality of racks in a composite manner to achieve optimization. Further, improvements in the performances and functions of such IT devices and NW devices are prominent, so that frequencies of exchanges, expansions, and the like of the devices have been increased accordingly. It is necessary to expand and exchange those devices online.

Known is a technique that is developed to support rack plates or the like on which various devices are loaded to mount angles or mount rails attached to a rack (see Japanese Unexamined Patent Publication 2003-159129 (Patent Document 1), for example).

As an example of an L-type rail attaching structure disclosed in Patent Document 1, there is shown a structure in which the L-type rail is divided to two slidable parts on the front and rear sides for making it possible to change the length of the L-type rail.

In this structure, parallel pins are attached to the front end part of the front rail and the rear end part of the rear rail of the L-type rail. Those parallel pins are inserted to attachment holes of the mount angles and the mount rails. Thereafter, attachment screws are inserted through optimum screw holes among a plurality of attachment screw holes formed on the front rail and the rear rail to be fastened.

Further, there are also mount kits used for rack loaded devices, which employ a one-touch mechanism. In most of those mount kits, a lock part thereof is directly operated to release the lock of the one-touch mechanism.

However, in the rack mount device of the Patent Publication described above, first, the parallel pins of either one of the rails are inserted into the pin attachment holes of the mount angle. Thereafter, the other rail is slid to the mount rail side, and the parallel pins of that rail are inserted to the pin attachment holes of the mount rail. Then, both rails are slid to be in a stretched state, and attachment screws are inserted into the attachment holes of both rails for fastening the rails to keep that state. This requires a lot of efforts and troublesome works.

Further, since both rails are fastened by inserting the attachment screws into the attachment holes of the both rails, the attachment screws may be loosened and the both rails may be contracted due to an oscillation and the like if the fastening force is weak. If so, the parallel pins of the both rails come out, and the L-type rail is detached from the mount rail. As a result, the rack loaded device placed on the top face of the L-type rail falls down, and it may be damaged.

Further, when the parallel pins are inserted completely into the pin attachment holes of the mount rail and the like, it may not be always possible to find the optimum attachment screw holes for keeping that state among the plurality of attachment screw holes of the rail and the like. Thus, even when the attachment screws are inserted into the attachment screw holes in a condition closest to optimum to be fastened, the entire length of the L-type rail becomes short. As a result, there is a play generated in the lengthwise direction between the parallel pins on the both ends of the L-type rail and the pin attachment holes of the mount rail or the like. In that case, after the rack loaded device is mounted to the L-type rail, the rack loaded device may become shifted for the amount of the play due to an oscillation and the like. This may impose an adverse effect on the rack loaded device.

Furthermore, the lock part for fixing the mount kit to the rack is provided to the one-touch function of the mount kit used for the rack loaded device, and the lock part is provided to the back face of the mount kit in most of the cases. A stopper is provided to the lock part, so that it is necessary to release the stopper by inserting a hand to the back face of the rack mount kit for releasing the lock.

On the above and the underneath of the rack loaded device, devices such as other rack loaded devices are placed without a space. In such state, it is necessary to insert the hand to the back face of the mount kit further into the narrow gap to release the stopper for releasing the lock when exchanging the rack mount kit. This work therefore is difficult, so that the efficiency of exchange work becomes poor.

In the worst case, the devices above and underneath the device to be exchanged may also need to be detached once. This is not suitable for online maintenance, and the devices to be employed may become limited.

Further, Japanese Unexamined Patent Publication 2000-332877 (Patent Document 4) discloses a tool for hanging an electric communication device on a wall. This tool of Patent Document 4 is capable of changing the dimensions in the width direction and the height direction. However, with this tool, the tool main body needs to be fixed to the wall with a bolt. Therefore, there is a difficulty in its attachment and detachment.

Furthermore, Japanese Unexamined Utility Model Publication 61-109189 (Patent Document 2) discloses a structure for mounting a package of an electronic component to a shelf, which is structured to have a part of plate spring attached to the package engaged with a perpendicular face of the shelf. However, this structure needs a devise for being applied to the rack mount device, and it cannot be applied as it is.

Further, Japanese Unexamined Utility Model Publication 03-067476 (Patent Document 3) discloses a structure for attaching an electronic device to a mount. With this structure, the electronic device is loaded and detached to/from the mount by utilizing the principle of the lever. Since the principle of the lever is used, the mechanism itself becomes large-scaled. Thus, this structure cannot be applied to the rack mount device as it is, and it is necessary to apply a devise to be employed to the mount rack device.

SUMMARY OF THE INVENTION

In order to overcome each of the foregoing issues, it is an exemplary object of the present invention to provide a rack mount device for loading a rack loaded device, which can be easily and surely connected and mounted to a rack and can be detached by easily releasing the connection.

In order to achieve the foregoing exemplary object, a rack mount device according to an exemplary aspect of the invention includes: a pair of mount kits for holding a rack loaded device, which are arranged to oppose to each other and connected in a freely detachable manner to pole brace members provided at four corners to configure a rack. Each of the pair of mount kits is configured with a front mount and a rear mount which are formed to be freely slidable with respect to each other in a longitudinal direction thereof. Kit connecting mechanisms are provided at both end parts of each of the mount kits for connecting each of the mount kits to the pole brace members, and connection releasing mechanisms are provided to the kit connecting mechanisms for releasing connections between the mount kits and the pole brace members.

Further, a connection release mechanism is provided to the kit connecting mechanism, so that the connection of the mount kit and the pole brace members can be released by operating the connection release mechanism. Therefore, the mount kits can be detached by releasing the connection easily.

BRIEF DESCRIPTION OF THE DRAWINGS

FIG. 10B is an illustration showing a sixth state;

FIG. 15 is a plan sectional view showing an end part of the front mount according to the second exemplary embodiment;

FIG. 16 is a plan sectional view showing an end part of a rear mount according to the second exemplary embodiment;

DETAILED DESCRIPTION OF THE EXEMPLARY EMBODIMENTS

Hereinafter, a first exemplary embodiment of a rack mount device (simply referred to as a device hereinafter) 10 of the present invention will be described by referring to FIG. 1-FIG. 8.

Figure 1:
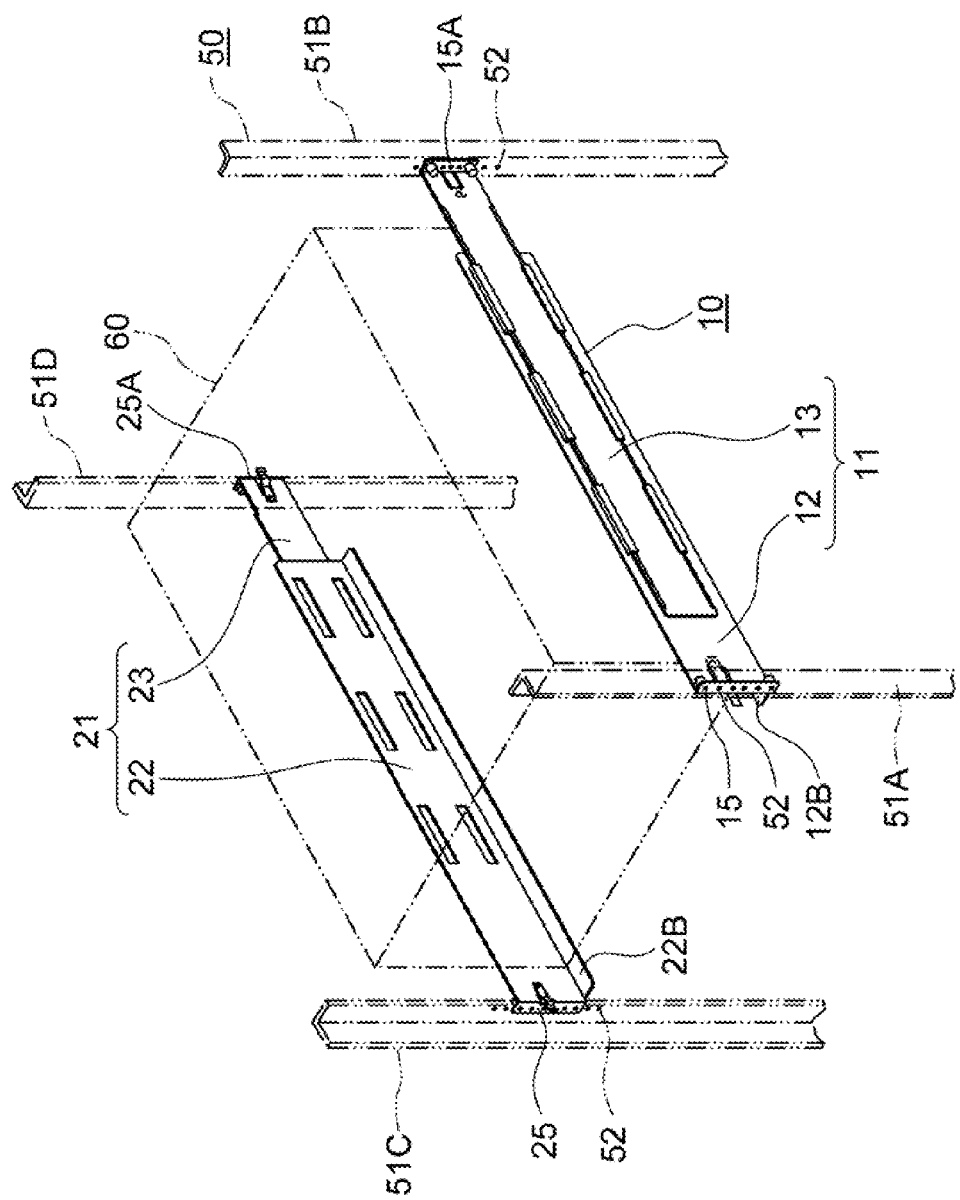
FIG. 1 is an overall perspective view showing a first exemplary embodiment of a rack mount device of the invention.
Figure 2:
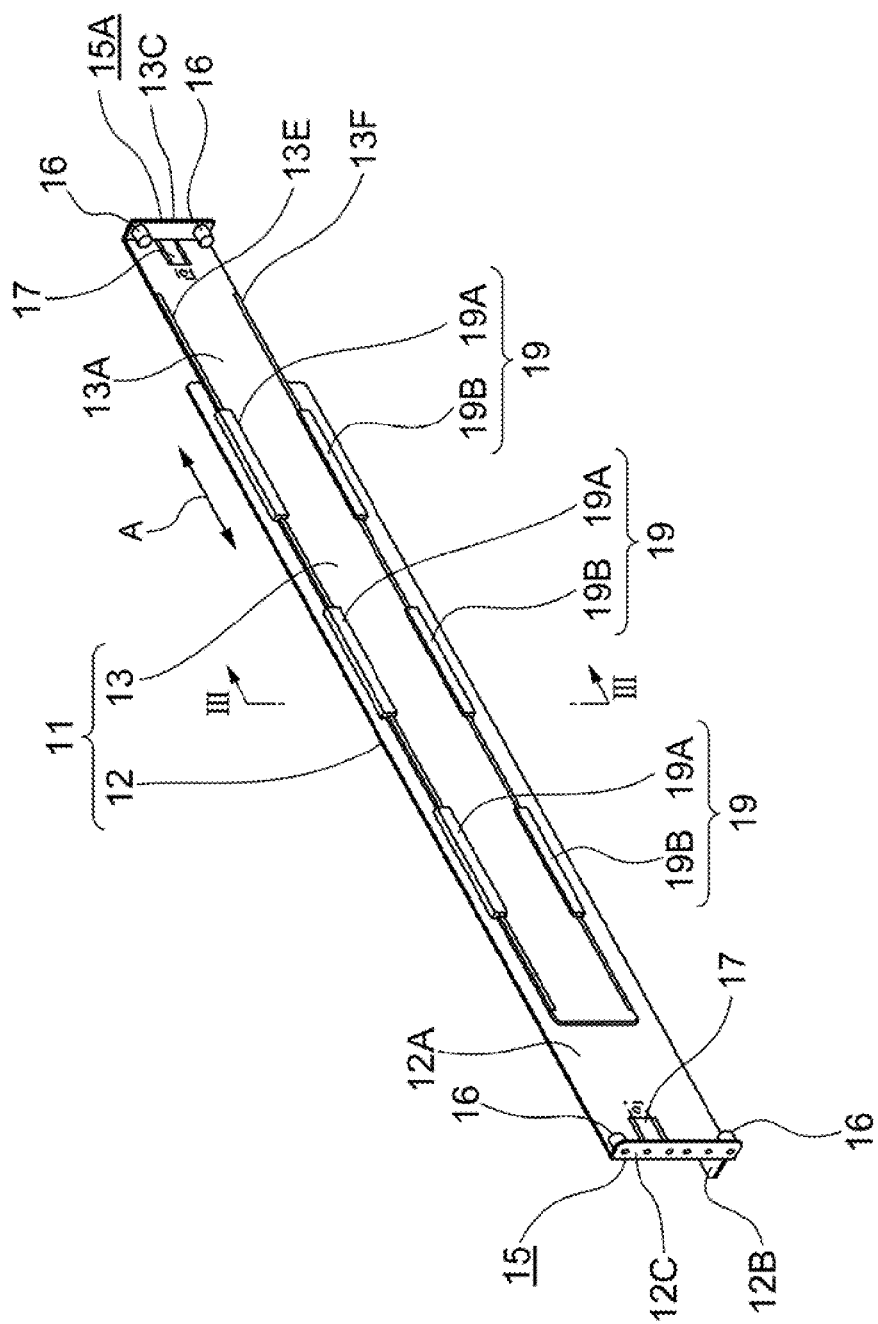
FIG. 2 is an overall perspective view showing a first kit of the first exemplary embodiment.
Figure 8:
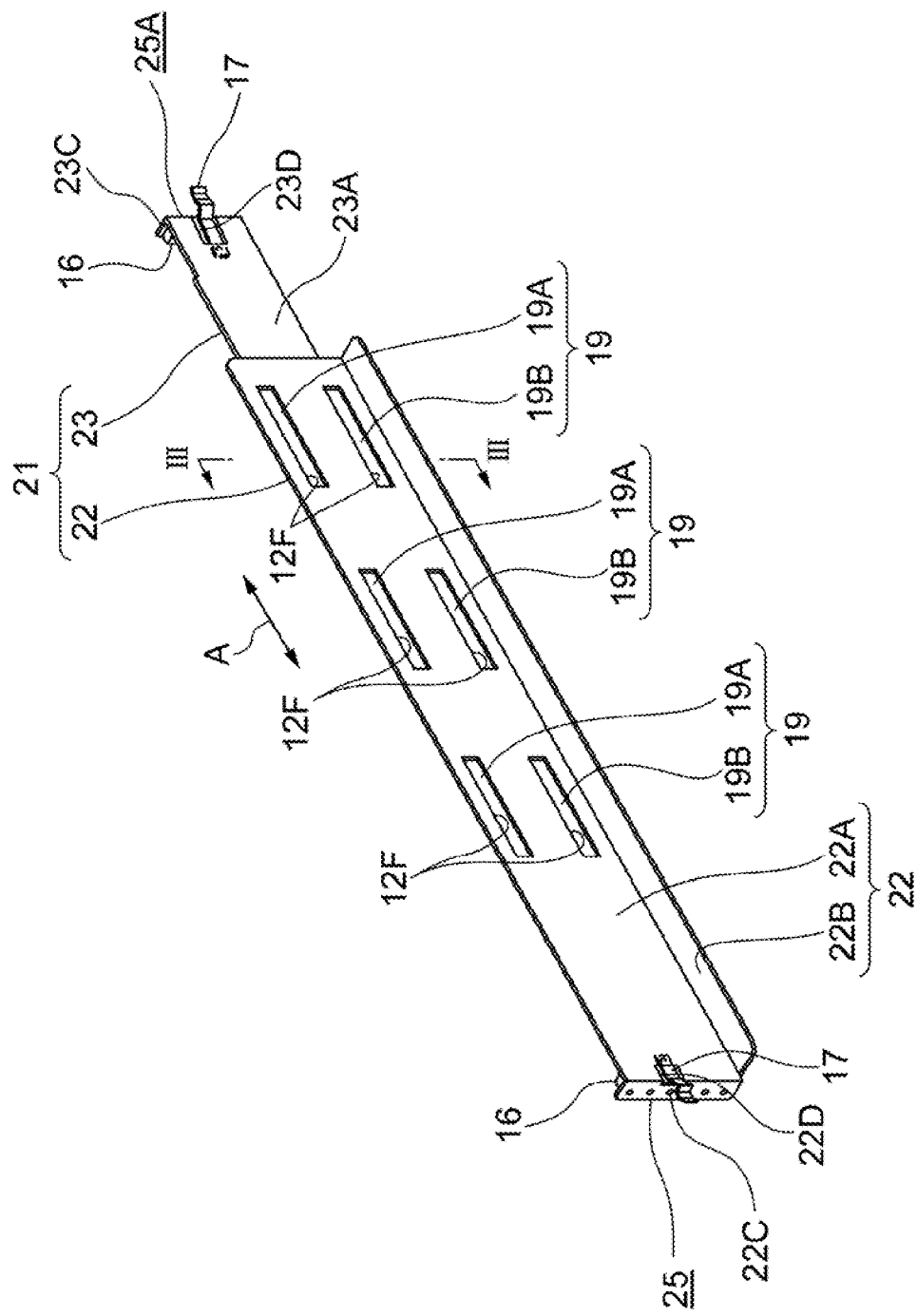
FIG. 8 is an overall perspective view showing a second kit of the first exemplary embodiment.

FIG. 1 shows an overall perspective view of a state where the device 10 is attached to a rack 50. FIG. 2 shows an overall perspective view of a first rack mount kit (simply referred to as a first kit) 11 out of a pair of mount kits which configure the device 10. FIG. 8 shows an overall perspective view of a second rack mount kit (simply referred to as a second kit) 21 out of a pair of mount kits which configure the device 10. The device 10 is provided with a rack loaded device 60 such as an electronic device or the like.

First, the rack 50 to which the device 10 is attached will be described by referring to FIG. 1.

The rack 50 includes mount angles 51A, 51B, 51C, and 51D as pole brace members provided at the four corners. Circular positioning holes 52 (also see FIG. 7), for example, are opened at equal intervals in the vertical direction on each side surface of the mount angles 51A-51D where the first kit 11 and the second kit 21 are to be mounted.

As shown in FIG. 1, the first kit 11 and the second kit 21 are in a pair, and those are formed in bilateral symmetry (in a symmetrically opposite manner) with respect to the rack loaded device 60. While the kits 11 and 21 are formed in bilateral symmetry as described above, the structures thereof are completely the same.

As shown in FIG. 1 and FIG. 2, the first kit 11 includes a front mount 12, and a rear mount 13 which is provided along the longitudinal direction (arrow-A direction) of the front mount 12 to be slidable mutually with the front mount 12.

Through forming the front mount 12 and the rear mount 13 to be mutually slidable, the entire length of the first kit 11 can be adjusted.

As a result, it becomes possible to correspond freely to the distance between the mount angles 51A and 51B of the rack 50.

Figure 3:
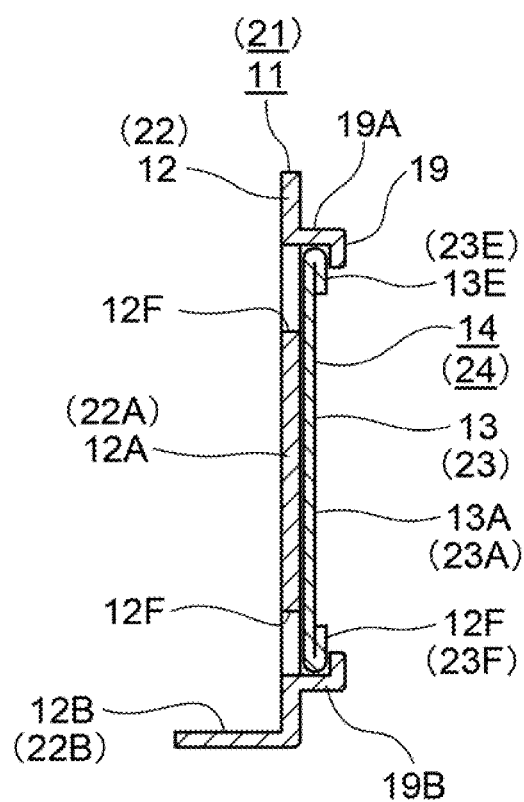
FIG. 3 is a longitudinal sectional view taken along a line III-III of FIG. 2.

As shown in FIG. 3, the front mount 12 is formed by performing bending processing or the like of a thin steel plate, for example, and it has a guide surface part 12A which is in a prescribed width and in a prescribed length for slidably guiding the rear mount 13.

A mount part 12B is provided to the width-direction lower end part of the guide surface part 12A as a holding face for loading and holding the bottom part of the rack loaded device 60. The mount part 12B is formed in a narrower width than the width of the guide surface part 12A. Further, those guide surface part 12A and the mount part 12B are formed in L-letter form in terms of sectional view, which is bent at 90 degrees by the bending processing, for example. Both parts 12A and 12B are substantially in a same length. Furthermore, the mount part 12B is facing towards the second kit 21 side.

A front-side kit connecting mechanism 15 for connecting the front mount 12 to the mount angle 51A is provided at one end that is on the opposite side from the rear mount 13 in the longitudinal direction of the front mount 12.

Figure 4A:
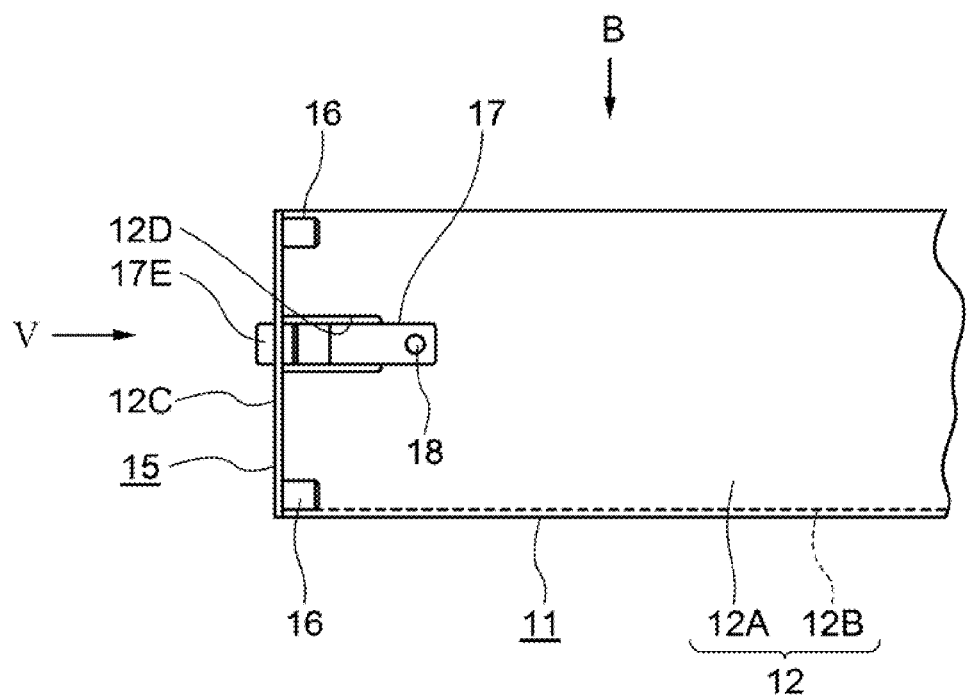
FIG. 4A is an elevational detail view showing an end part of a front mount which configures the first kit according to the first exemplary embodiment.
Figure 4B:
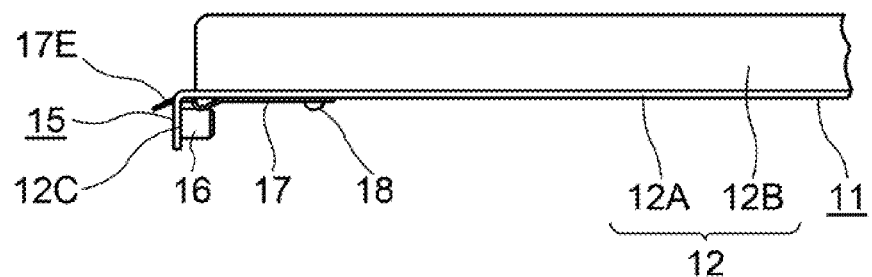
FIG. 4B is a view from an arrow B of FIG. 4A.
Figure 5:
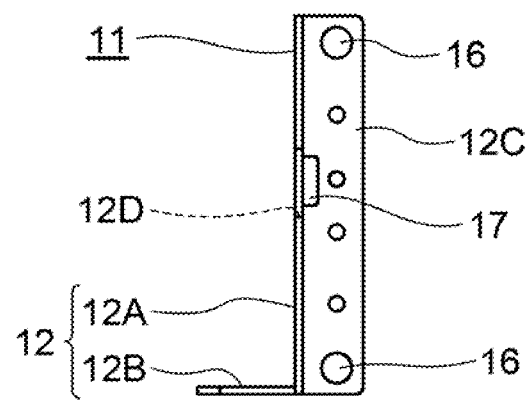
FIG. 5 is a view from an arrow V of FIG. 4.
Figure 6:
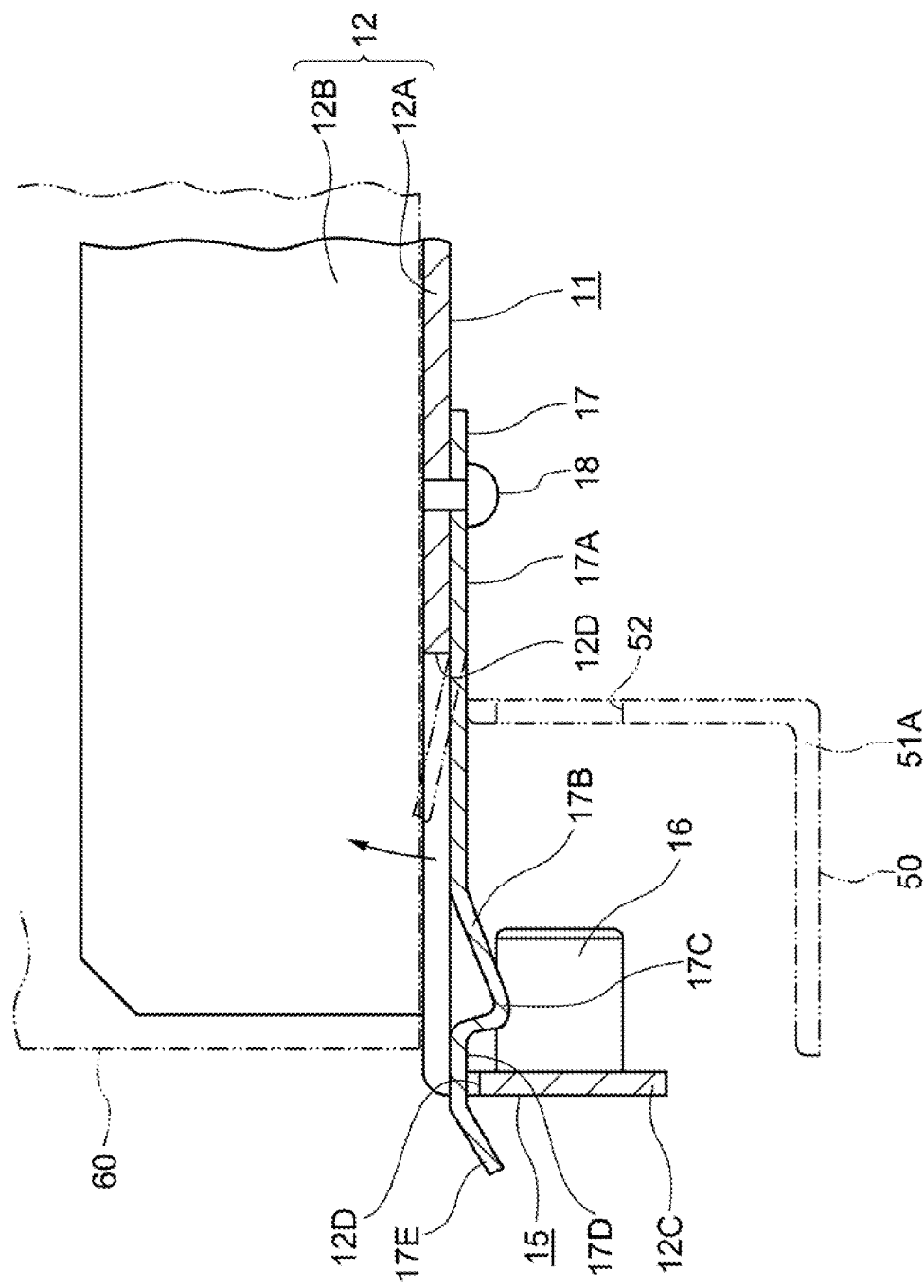
FIG. 6 is a plan sectional view showing an end part of the front mount according to the first exemplary embodiment.

As shown in FIG. 4-FIG. 6 in detail, this kit connecting mechanism 15 has a front-side holding part 12C formed by bending an end part of the guide surface part 12A at 90 degrees by the bending processing, for example, towards the opposite side from the mount part 12B, i.e., towards the opposite side from the rack loaded device 60.

Positioning pins 16 arranged towards the rear mount 13 side (inner side) are attached to both end parts of the front-side holding part 12C in the height direction. The two positioning pins 16 are respectively formed by a columnar member so as to be engaged with circular positioning holes 52 of the mount angle 51A, and fixed to the inner-side face of the holding part 12C with a prescribed space from the guide surface part 12A by welding or the like.

The front-side holding part 12C and the positioning pins 16 configure an engaging device for engaging the front mount 12 with the mount angle 51A.

The positioning pin 16 may not have to be a circular member, unlike the above-described case. The positioning pin 16 may be formed in accordance with the shape of the positioning hole 52 of the mount angle 51A. For example, when the shape of the positioning hole 52 of the mount angle 51A is a quadrilateral shape, the positioning pin 16 may be formed with a quadrangular-prism member by corresponding to the shape of the hole.

As shown in FIG. 4A and FIG. 6, a front-side angular hold 12D as a front-side opening part is opened in the vicinity of the holding part 12C of the front mount 12. This front-side angular hole 12D is formed in substantially the center part of the guide surface part 12A in the width direction by punching processing or the like in a prescribed width from the vicinity of the side end part of the holding part 12C of the guide surface part 12A to the middle of the holding part 12C in the width direction.

Such front-side angular hole 12D is covered by a stopper member 17 that is a front-side guide member.

That is, the stopper member 17 is formed with a plate spring member, and a fixed end part of the stopper member 17 facing towards an edge part of the rear mount 13 side of the front-side angular hole 12D is fixed to the guide surface part 12A via a rivet 18 or welding, etc., for example. The stopper member 17 is attached to the front-side holding part 12C side of the guide surface part 12A.

As shown in FIG. 6 in detail, the other end side of the stopper member 17 is formed as a flat surface 17A to a midway position of the front-side angular hole 12D, and as a slope guide part 17B which is a slope part sloping towards the front-side holding part 12C side and to the direction away from the flat surface 17A (i.e., sloping towards the front-side holding part 12C side) in a prescribed range from the midway position of the flat surface 17A to the tip end side.

The tip end side of the slope guide part 17B works as an engaging projection part 17C which engages with the tip end part of one side of the mount angle 51A which configures the rack 50.

A locking part 17D, which is formed on an extended line of the flat surface 17A to be engaged with the tip end part of one side of the mount angle 51 and locked to the mount angle 51, is formed at the tip of the engaging projection part 17C.

This locking part 17D is formed by being bent at substantially 90 degrees from the engaging projection part 17C to the flat surface 17A side, and then extended to a position passed over the front-side angular hole 12D of the front-side holding part 12C. With this, the tip end part of one side of the mount angle 51A configuring the rack 50 after going over the engaging projection part 17C can be pressed and held with the part being bent from the engaging projection part 17C and the front-side holding part 12C. As a result, the stopper member 17 as well as the front mount 12 can be connected and locked to the mount angle 51A.

A tip operating part 17E as a connection releasing mechanism that is being slightly bent towards the outer side from the locking part 17D is formed on the tip end side of the locking part 17D. As described above, the locking part 17D is extended from the middle of the tip end side to a position passed over the angular hole 12D of the front-side holding part 12C. Thus, the tip operating part 17E is also extended out towards the outer side from the front-side holding part 12C.

Therefore, after connecting the front mount 12 to the mount angle 51, when it becomes necessary to detach the front mount 12 as well as the first kit 11, those can be detached by operating the tip operating part 17E from the outer side of the mount angle 51.

That is, a locking device is configured with the stopper member 17 and the angular hole 12D.

As described above, the stopper member 17 is formed with a plate spring member, and the fixed end part is fixed to the guide surface part 12A. Thus, when the slope guide part 17B and the engaging projection part 17C are pressed by the tip end part of one side of the mount angle 51A, the slope guide part 17B, the engaging projection part 17C, and the like are shifted towards the front-side angular hole 12D side as illustrated with a virtual line of FIG. 6 by having the edge part of the front-side angular hole 12D of the guide surface part 12A as a start point.

Further, when the engagement of the stopper member 17 and the mount angle 51A is released, the stopper member 17 returns to the initial shape and position because of the restoring force of the plate spring member.

That is, the front angular hole 12D of the front mount 12 is formed to tolerate the shift of the stopper member 17 towards the guide surface part 12A side.

Note here that the locking device is configured with the stopper member 17 and the front-side angular hole 12D, and the front-side kit connecting mechanism 15 is configured with the front-side holding part 12C, the positioning pin 16, the front-side angular hole 12D, and the stopper member 17.

Returning to FIG. 2, as described above, the rear mount 13 and the front mount 12 are freely slidable with respect to each other along the respective longitudinal direction. The rear mount 13 is also formed with a thin steel plate, for example, and has a slide surface 13A whose width is smaller than that of the front mount 12.

The width-direction top end part and lower end part of the slide surface 13A of the rear mount 13 are formed by folding a prescribed width of the slide surface 13A of the rear mount 13, and the top end part and the lower end part form slide rail parts 13E and 13F.

A part corresponding to the mount part 12B of the front mount 12 is not formed in the rear mount 13.

Figure 7:
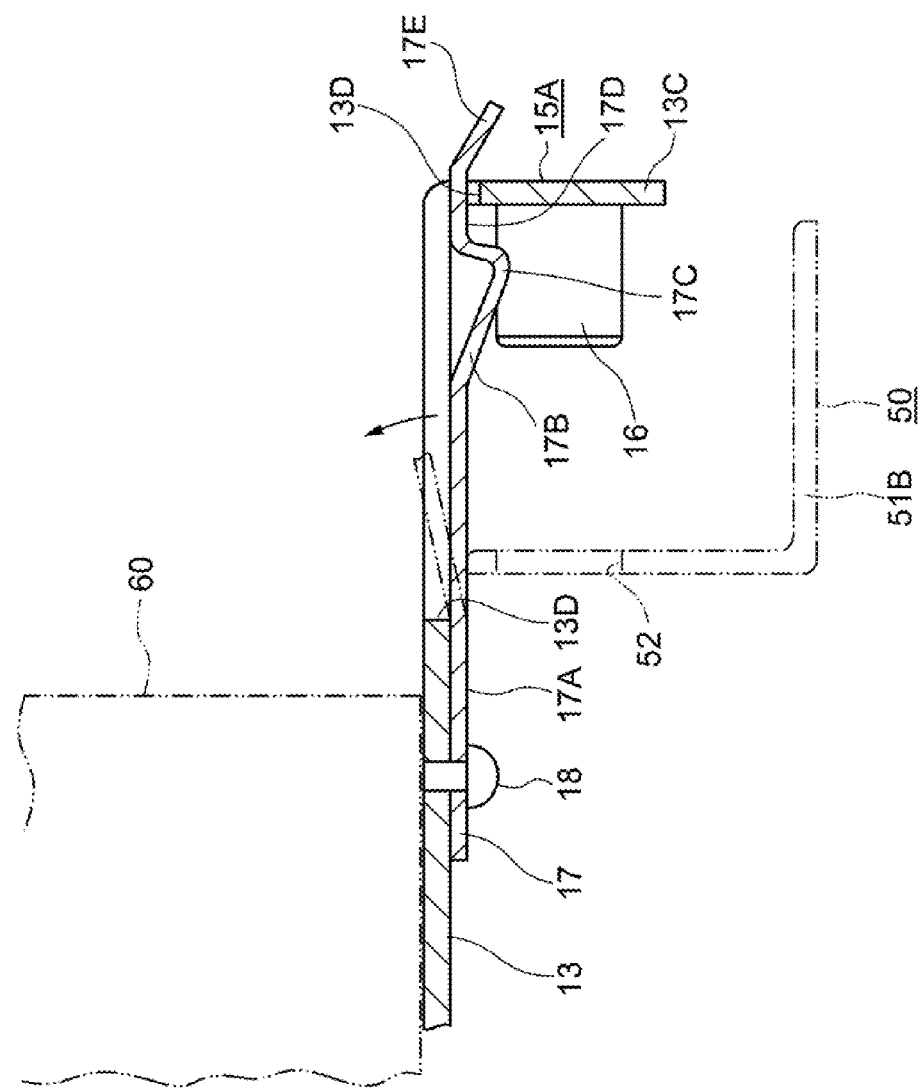
FIG. 7 is a plan sectional view showing an end part of a rear mount according to the first exemplary embodiment.

As shown in FIG. 7 in detail, a rear-side kit connecting mechanism 15A is provided at the end part of the slide surface 13A of the rear mount 13, which is at the end part on the opposite side from the front mount 12.

That is, a rear-side holding part 13C bent in the same direction as that of the holding part 12C is formed an the end part of the slide surface 13A of the rear mount 13, and the positioning pins 16 are provided on the inner surface of the rear-side holding part 13C by being arranged in both end parts of the height direction. Further, a rear-side angular hole 13D in the same shape as that of the front-side angular hole 12D is opened in the end part of the rear-side holding part 13C side of the slide surface 13A, and the stopper member 17 is provided to cover the rear-side angular hole 13D.

The stopper member 17 of the front mount 12 and the stopper member 17 of the rear mount 13 are completely in the same shape except that the facing directions thereof are different. Therefore, the same reference numerals are applied to the members.

Note here that the rear-side kit connecting mechanism 15A is configured with the rear-side holding part 13C, the positioning pin 16, the rear-side angular hole 13D, and the stopper member 17.

The rear-side kit connecting mechanism 15 as described above is locked to the mount angle 51B among the four mount angles 51A-51D.

The slide structure of the rear mount 13 and the front mount 12 in the structures described above is formed in the manner as shown in FIG. 3.

That is, a guide member 19 for guiding the slide rail parts 13E and 13F is formed in the guide surface part 12A of the front mount 12, such that the guide member 19 is a slide rail part guide member 19.

The guide member 19 is provided at three points in the longitudinal direction of the guide surface part 12A of the front mount 12. Each guide member 19 is configured with an upper-side guide 19A and a lower-side guide 19B, as shown in FIG. 2 and FIG. 3.

The upper-side guide 19A is formed in a following state. That is, a substantially U-shaped narrow-groove cut is formed in the longitudinal direction of the guide surface 12A, the corresponding part is folded substantially at 90 degrees along the cut, and substantially a half of the bent part is bent downwards to be in parallel to the guide surface part 12A, i.e., the L-shaped (section) member is attached in such a manner that the level part comes on the top. This part functions as the guide part of the rear guide 13, and also as a slip-out preventing part.

After folding it at about 90 degrees towards the upper side along the cut, there is formed a rectangular opening part 12F as shown in FIG. 3.

The lower-side guide 19B is formed in a following state. That is, a substantially U-shaped narrow-groove cut is formed in the longitudinal direction of the guide surface 12A, the corresponding part is folded substantially at 90 degrees along the cut, and substantially a half of the bent part is bent upwards to be in parallel to the guide surface part 12A, i.e., the L-shaped (section) member is attached in such a manner that the level part comes on the bottom. This part functions as the guide part of the rear guide 13, and also a slip-out preventing part.

After folding it at about 90 degrees towards the upper side along the cut, there is formed a rectangular opening part 12F as shown in FIG. 3 also in the lower-side guide 19B.

As described above, the rear mount 13 guided by the guide member 19 that is configured with the upper-side guide 19A and the lower-side guide 19B can be slid freely along the guide surface part 12A of the front mount 12.

Returning to FIG. 1, the second kit 21 is formed in bilateral symmetry with the first kit 11 as described above, and disposed to oppose with each other. Further, the second kit 21 is connected to the mount angles 51C and 51D which configure the rack 50.

That is, as described above and as shown in FIG. 8 in detail, both the second kit 21 and the first kit 11 are substantially in the same structure except that the facing directions thereof are different.

The second kit 21 is configured with a front mount 22 and a rear mount 23 that is freely slidable with respect to the front mount 22.

Note here that the front mount 22 is formed with a guide surface part 22A and a mount part 22B that is the holding surface, and it is in the same structure as that of the front mount 12 of the first kit 11. The mount part 22B of the front mount 22 of the second kit 21 opposes to the mount part 12B of the front mount 12 of the first kit 11, and the rack loaded device 60 is to be placed on the top face of the both mount parts 12B and 22B.

A front-side kit connecting mechanism 25 in the same structure as that of the front-side kit connecting mechanism 15 of the first kit 11 is provided to one end of the front mount 22 on the opposite side of the rear mount 23. Further, the stopper member 17 is provided in the vicinity of the front-side kit connecting mechanism 25 of the guide surface part 22A. Since the second kit 21 is formed in bilateral symmetry with the first kit 11, the stopper member 17 is provided on the opposite side of the mount part 22B by sandwiching the guide surface part 22A.

Furthermore, the guide member 19 is provided at three points along the longitudinal direction of the guide surface part 22A of the front mount 22.

The rear-side holding part 23C of the rear mount 23 and the rear-side holding part 13C of the rear mount 13 of the first kit 11 are completely in the same structure except that the facing direction of the rear-side holding part 23C is different from that of the rear-side holding part 13C. A rear-side kit connecting mechanism 25A in the same structure as that of the rear-side kit connecting mechanism 15A of the first kit 11 is provided to one end of the rear mount 23. Further, the stopper member 17 is provided in the vicinity of the rear-side kit connecting mechanism 25 of the slide surface part 23A.

In FIG. 8, the slide mechanism of the front mount 22 and the rear mount 23 is structured as in a section taken along a line III-III of FIG. 8, i.e., as in FIG. 3. Note, however, that the front mount 22 and the rear mount 23 of the second kit 21 are shown in parentheses in FIG. 3.

Next, a procedure for connecting and locking the front mount 12 of the first kit 11 to one mount angle 51A of the rack 50 will be described by referring to FIG. 9-FIG. 1 among the operations of attaching the device 10 of the first exemplary embodiment to the rack 50.

Figure 9A:
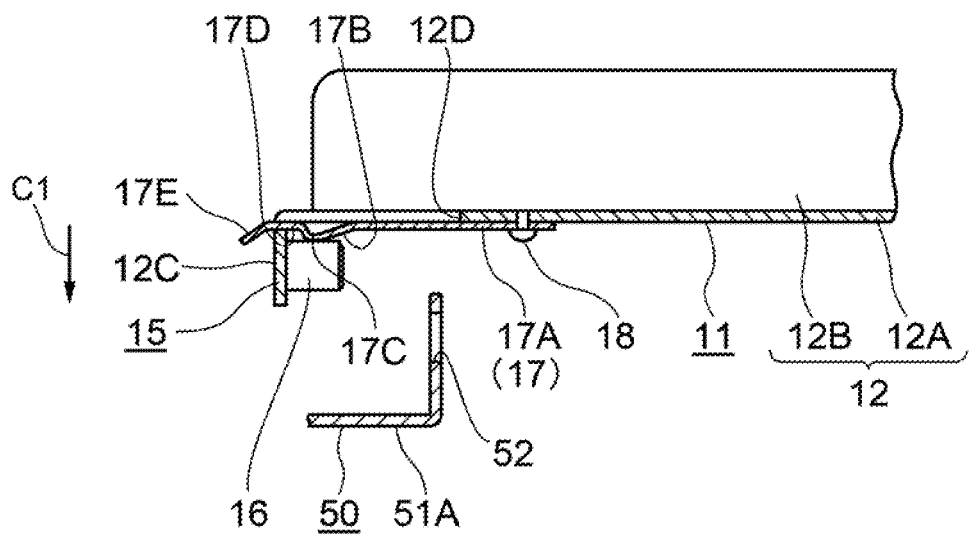
FIG. 9A is an illustration of a first state showing a process when connecting the front mount of the first exemplary embodiment to a mount angle.

For attaching the front mount 12 to one mount angle 51A among the four mount angles 51A-51D of the rack 50, first, the end part of the front mount 12 on the kit connecting mechanism 15 side is brought closer to the mount angle 51A as shown in FIG. 9A.

At this time, the length of the first kit 11 is set to be almost conformed to the distance between the mount angles 51A and 51B of the rack mount 50 by relatively sliding the front mount 12 and the rear mount 13.

Figure 9B:
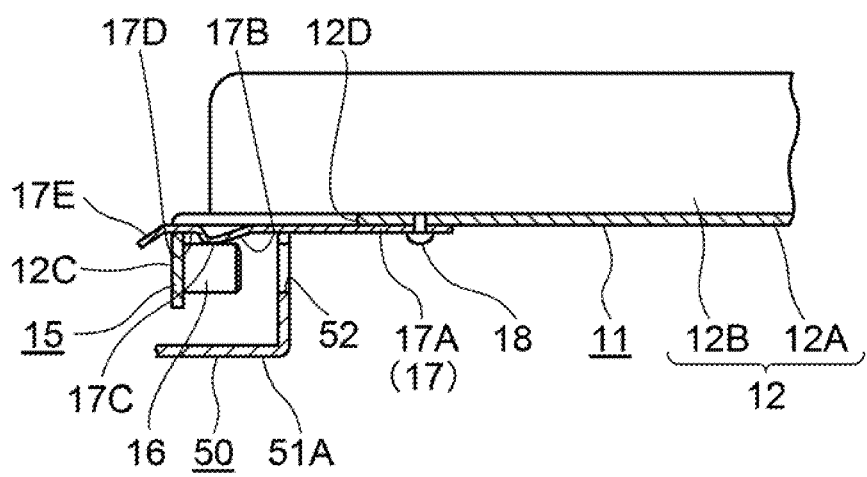
FIG. 9B is an illustration showing a second state.

Next, the front mount 12 is shifted to the direction shown by an arrow C1 of FIG. 9A. Then, as shown in FIG. 9B, the surface of the flat surface 17A of the stopper member 17 is pressed against the tip end of one side of the mount angle 51A.

Figure 10A:
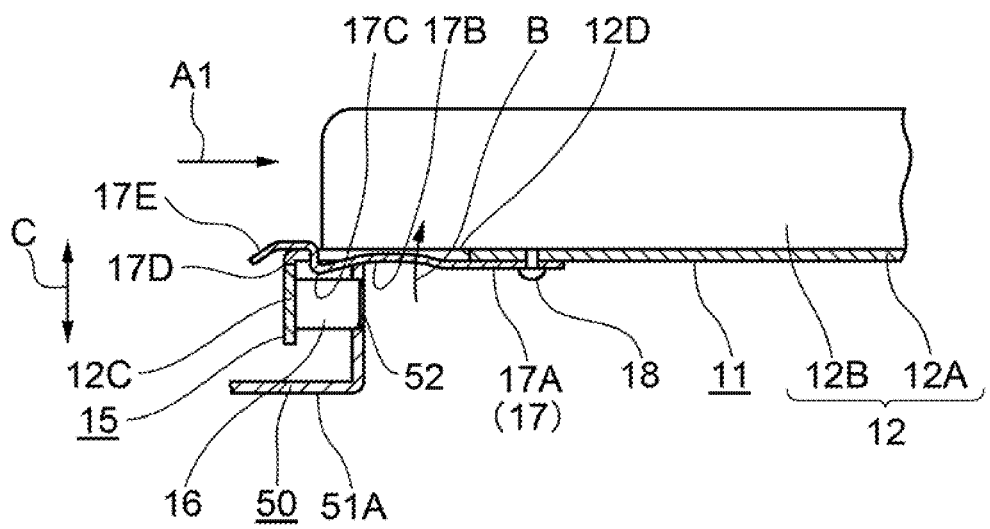
FIG. 10A is an illustration of a third state showing a process when connecting the front mount of the first exemplary embodiment to a mount angle.

Thereafter, while keeping that state, the front mount 12 is shifted to an arrow A direction as shown in FIG. 10A. With this, when the stopper member 17 provided to the front mount 12 shifts from the flat surface 17A to the slope guide part 17B, the slope guide part 17B and the like are shifted towards the front-side angular hole 12D side from the edge of the front-side angular hole 12D by having a proximal end of the stopper member 17 as the center as shown with an arrow B, by being pressed with the tip end of one side of the mount angle 51.

When the slope guide part 17B moves along the tip end of one side of the mount angle 51, the positioning pin 16 provided to the holding part 12C is inserted into the positioning hole 52 of the mount angle 51A to be set the position. This makes it possible to restrict the movements in an arrow C direction that is orthogonal to the moving directions of the front mount 12 and the first kit 11.

Figure 10B:
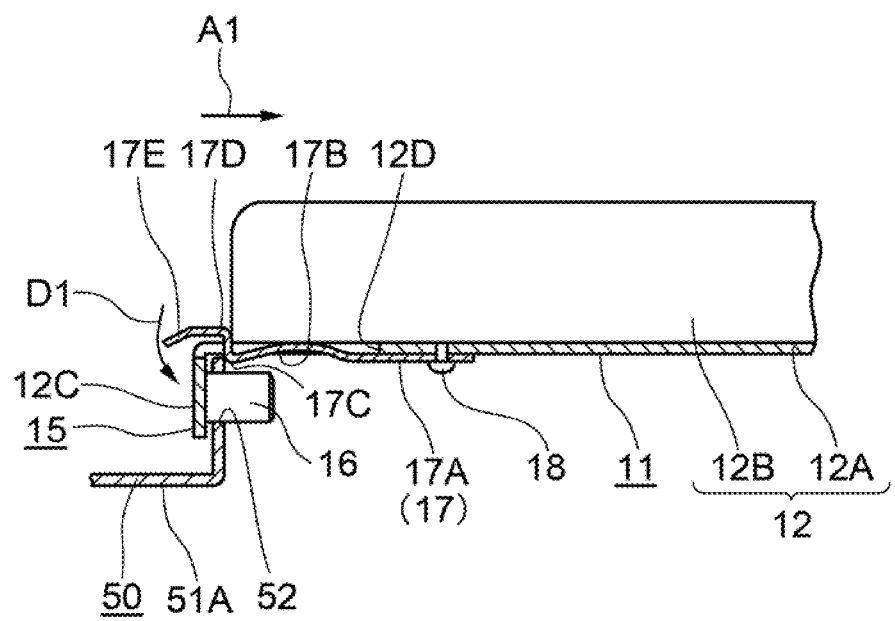
FIG. 10B is an illustration showing a fourth state.

Next, as shown in FIG. 10B, when the front mount 12 is further shifted towards the arrow A1 direction, the positioning pin 16 is completely inserted into the positioning hole 52 of the mount angle 51A of the rack 50. In the meantime, the tip end of one side of the mount angle 51A goes over the engaging projection part 17C and enters into the locking part 17D.

Figure 11A:
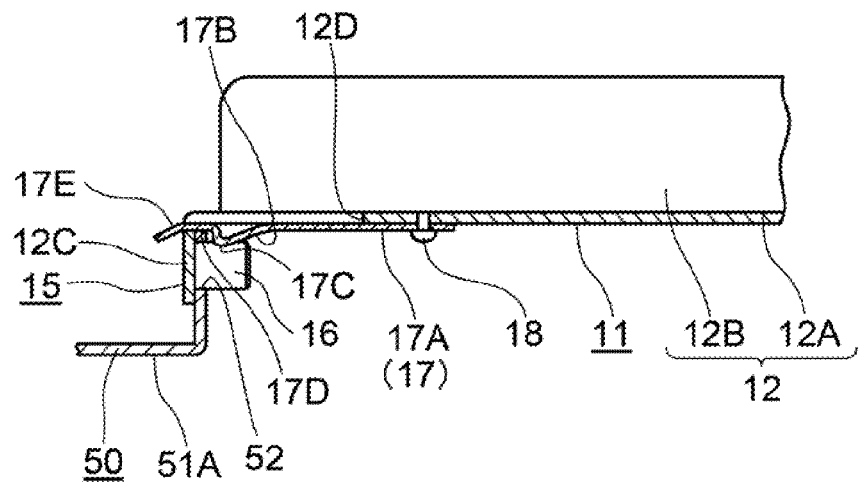
FIG. 11A is an illustration of a fifth state showing a process when connecting the front mount of the first exemplary embodiment to a mount angle.

At this time, the slope guide part 17B, the engaging projection part 17C, and the tip operating part 17E of the stopper member 17 return to the state of the initial positions from the state being pressed towards the front-side angular hole 12D because of the restoring force of the plate spring member and, as shown in FIG. 11A, the tip end of one side of the mount angle 51A is sandwiched between the engaging projection part 17C and the front-side holding part 12C. Thereby, the front mount 12 is connected to the mount angle 51A.

Figure 11B:
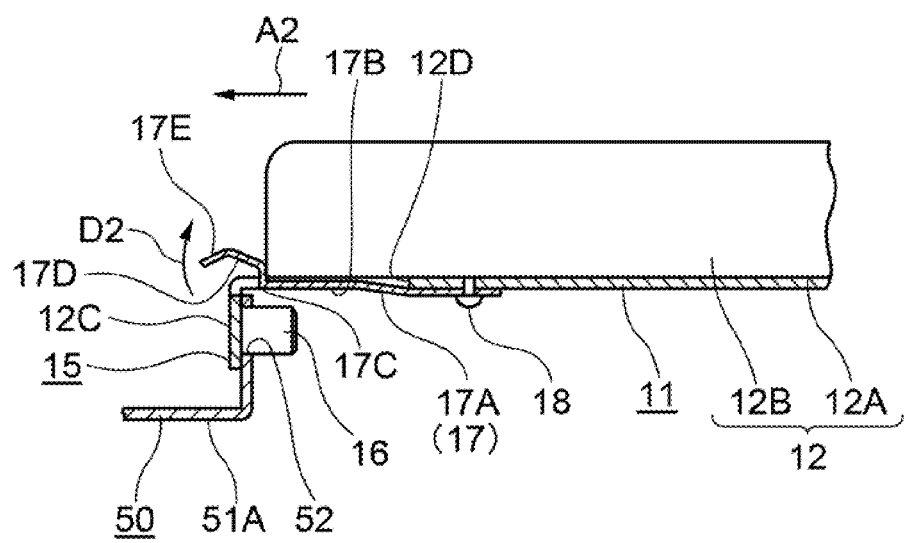
Figure 12:
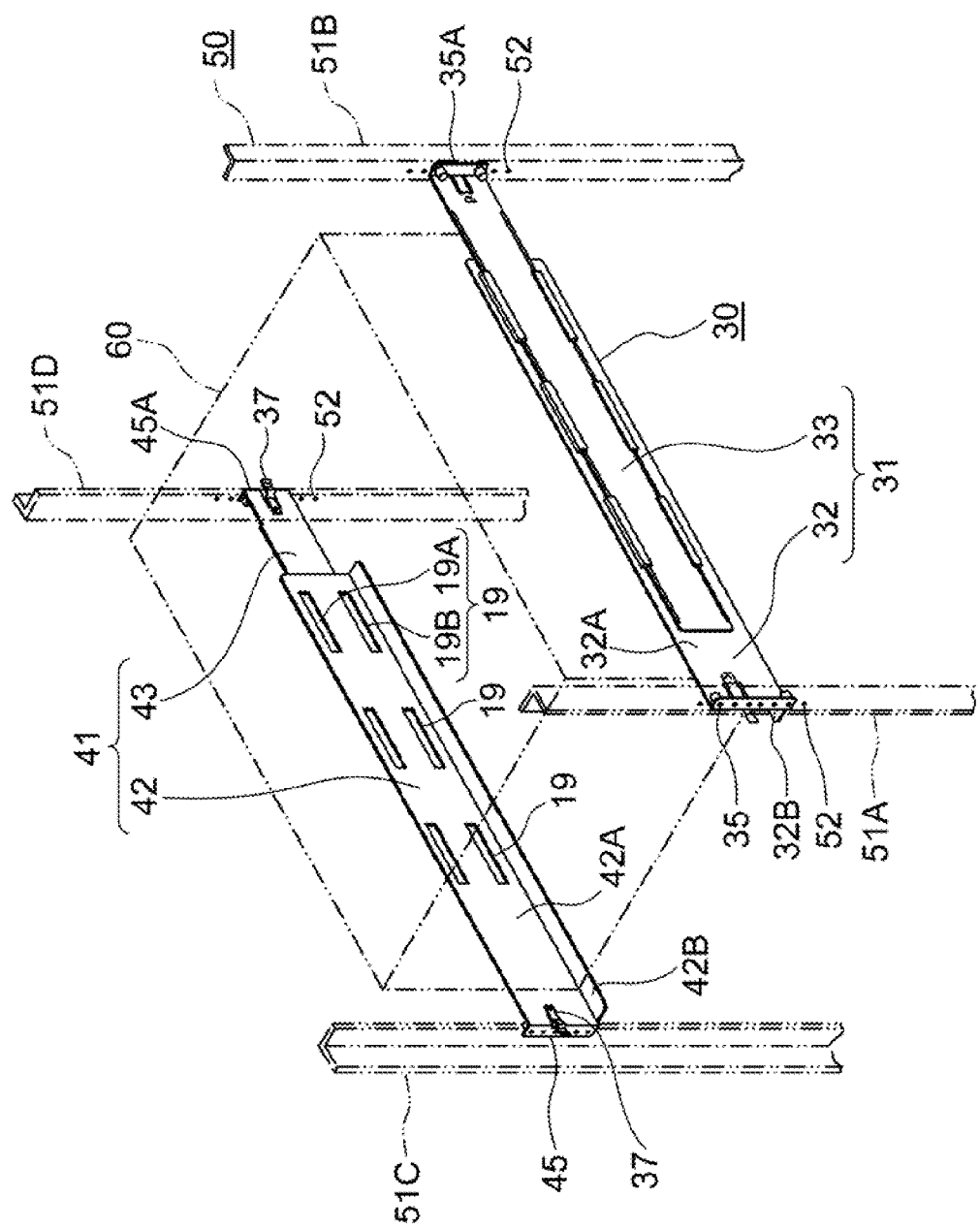
FIG. 12 is an overall perspective view showing a second exemplary embodiment of the rack mount device of the present invention.

When detaching the front mount 12 of the first kit 11 from the mount angle 51A of the rack 50, it is detached as shown in FIG. 11B.

That is, first, the operator pushes up the tip operating part 17E of the stopper member 17 towards an arrow D2 direction by using a finger or the like to release the locked state between the locking part 17D of the stopper member 17 and the tip end of one side of the mount angle 51. Thereafter, while keeping the engagement-released state, the front mount 12 is shifted towards an arrow A2 direction.

Upon this, the positioning pin 16 of the front mount 12 is pulled off from the positioning hole 52 of the mount angle 51A to be substantially in the same state that is shown in FIG. 9B. Thereafter, through shifting the front mount 12 towards a direction away from the mount angle 51A, the connection between the front mount 12 and the mount angle 51A is released.

While the procedure for attaching the front mount 12 to the mount angle 51A of the rack 50 has been described, the procedure for attaching the rear mount 13 to the mount angle 51B of the rack 50 is also the same except that the shifting direction of the rear mount 13 is inverted from the above case, and the effects thereof are completely the same as those of the front mount 12.

That is, the stopper member 17 and the like are functionalized by bringing the kit connecting mechanism 15A side of the rear mount kit 13 shown in FIG. 7 closer to the mount angle 51B so as to connect the rear mount 13 to the mount angle 51B. Further, the stopper member 17 and the like are functionalized to separate the rear-side kit connecting mechanism 15A side from the mount angle 51B to release the connection between the rear mount 13 and the mount angle 51B so as to detach the rear mount 13 from the mount angle 51.

While FIG. 9-FIG. 11 have been used to describe the procedure for connecting the front mount 12 of the first kit 11 to the mount angle 51A, the procedure for connecting the second kit 21 that is arranged to oppose to the first kit 11 to the mount angles 51C and 51D and the procedure for releasing the connection are also the same as the procedure shown in FIG. 9-FIG. 11.

Note, however, that the first kit 11 and the second kit 21 are arranged to oppose to each other as described above, so that the mount angle 51A in FIG. 9-FIG. 11 is the mount angle 51C in the second kit 21, and the mount part 12B is the mount part 22B. The mount angle 51C is shown in a parenthesis in FIG. 9-FIG. 11.

With the embodiment described above, effects as follows can be obtained.

(1) The first kit 11 and the second kit 21 configuring a pair of mount kits are mutually slidable in the longitudinal direction thereof. Thus, after arranging the kits 11 and 21 to oppose to the pole brace members 51A, 51B and the pole brace members 51C, 51D through adjusting the lengths of each of the kits 11 and 21, those kits 11 and 21 are connected to the respective pole brace members 51A, 51B, 51C, and 51D via the kit connecting mechanisms 15, 15A, 25, and 25A. Therefore, the device 10 can be easily and surely connected and mounted to the rack 50. As a result, the rack loaded device 60 can be loaded easily and quickly.

(2) In the kit connecting mechanisms 15, 15A, 25, 25A, the tip operating parts 17E and 37E each configuring the connection releasing mechanism are provided, respectively, to the stopper members 17 and 37. Through operating the tip operating parts 17E, 37E by catching it with a hand, for example, the connection between the first and second kits 11, 21 and the pole brace members 51A, 51B, 51C, 51D can be released easily. As a result, the first kit 11 and the second kit 21 can be easily released from the pole brace members 51A, 51B, 51C, and 51D.

(3) The tip operating parts 17E, 37E are provided to the stopper members 17, 37, and the tip operating parts 17E, 37E are located on the outer side of the both ends of the First kit 11 and the second kit 21 of the length direction and outer side of the pole brace members 51A, 51B, 51C, and 51D. Thus, when detaching each of the kits 11 and 21, the connection can be released from the outside the rack 50 easily. Therefore, it is unnecessary to provide a locking mechanism within the loading area of the rack 50. As a result, the loading area can be effectively used to the maximum and, at the same time, connection can be released easily without removing other rack loaded devices.

(4) The stopper member 17 provided to the front mount 12 and the stopper member 17 provided to the rear mount 13 are formed with a plate spring member, respectively. One end of each stopper member is fixed, so that when the slope part 17B and the like are pushed, each stopper member is shifted to the front-side angular hole 12D and the rear-side angular hole 13D side, respectively, and returned to the original state due to the restoring force of the spring when the pressed state is released. Since the stopper members 17 are formed in this manner, the structure thereof is simple. This is the same for the stopper members 37.

(5) When connecting the front mount 12 and the rear mount 13 to the mount angles 51A, 51B, the mounts 12 and 13 are slid to the respective directions so that the mounts become close to each other. Thereby, two each of the positioning pins 16 provided to the front-side holding part 12C and the rear-side holding part 13C are fitted into the positioning holes 52 of the mount angles 51A, 51B, and both of the mounts 12, 13 are engaged with the mount angles 51A, 51B, respectively. As a result, movements of the rear mount 12 and the rear mount 13 towards the mount angles 51A, 51B side can be restricted. Thereby, the positions can be set securely. This effect can be achieved also for the front mount 22 and the rear mount 23 of the second kit 21.

(6) The slide rails 13C, 13D, 23C, and 23D of the rear mount 13 of the first kit 11 as well as the rear mount 23 of the second kit 21 are formed by folding the top and bottom end parts in the width direction of the slide surfaces 13A, 23A, so that the strength thereof is secured. Therefore, the slide rails are not to be bent or deformed when sliding the mounts. As a result, connection and releasing the connection of the first kit 11 and the second kit 21 can be done smoothly, thereby making it possible to improve the work efficiency.

The rack mount device of the present invention is structured in the manner described above. After the front mount and the rear mount configuring a pair of mount kits are placed to each pole brace member of the rack by facing with each other, those mounts are slid as necessary to be placed between each of the pole brace members. At the same time, each mount is connected to the respective pole brace members via the kit connecting mechanisms. Therefore, as an exemplary advantage according to the invention, the pair of mount kits can be connected to the rack by the effect of the kit connecting mechanisms by simply sliding the front mount and the rear mount. As a result, the rack mount device loading the rack loaded device can be easily and surely connected and mounted to the rack.

Next, a second exemplary embodiment of the rack mount device of the present invention will be described by referring to FIG. 12-FIG. 18.

A rack mount device (simply referred to as a device hereinafter) 30 of the second exemplary embodiment includes a first kit 31 and a second kit 41 as a pair, and the device 30 is so structured that the first kit 31 and the second kit 41 can be attached and connected, respectively, to the mount angles 51A, 51B and 51C, 51D which configure the rack 50 from the inner side thereof, or so structured that the connection can be released from the inners side.

In the first exemplary embodiment, the first kit 11 and the second kit 21 are attached while having each of the kits 11 and 21 contracted along the longitudinal direction, whereas each of the kits 31 and 41 of the second exemplary embodiment are attached and connected to the rack 50 by extending those kits in the longitudinal direction.

Therefore, in the device 30 of the second exemplary embodiment, the structures of front-side connecting mechanisms 35, 35A, 45, 45A provided to end parts of front mounts 32, 42 and rear mounts 33, 43 provided, respectively, to the first kit 31 and the second kit 41 are designed to be different from those of the first exemplary embodiment.

Other structures are the same as those of the front-side kit connecting mechanism 15 of the first exemplary embodiment. Therefore, same reference numerals are applied to the same structures and members, and detailed explanations thereof are omitted or provided in a simple manner.

Figure 13:
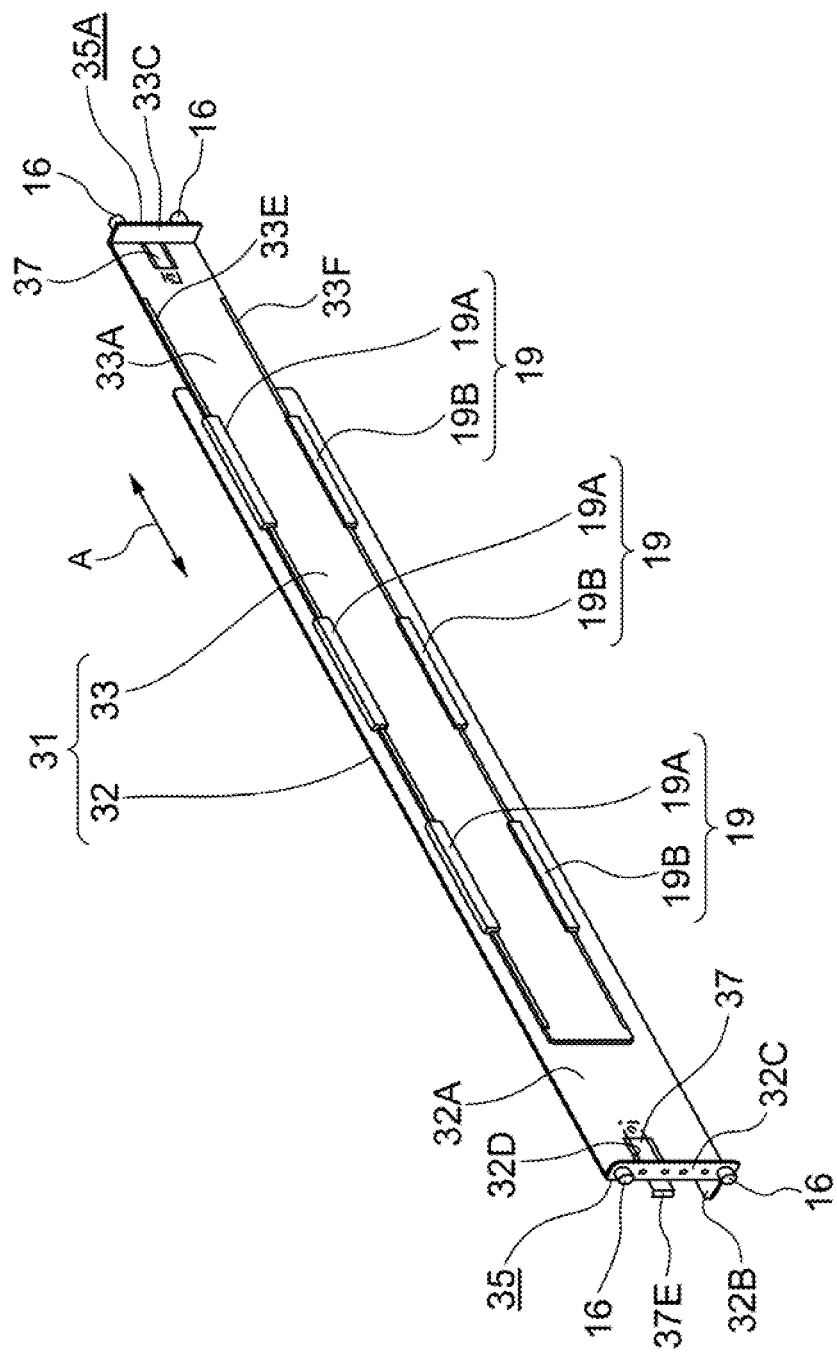
FIG. 13 is an overall perspective view showing a first kit of the second exemplary embodiment.

As shown in FIG. 13, the first kit 31 configuring the device 30 is configured with the front mount 32 and the rear mount 33. Further, the second kit 41 is configured with the front mount 42 and the rear mount 43.

The front mount 32 of the first kit 31 is formed with a guide surface part 32A and a mount part 32B, and it is in a same structure as that of the front mount 12 of the first kit 31.

A front-side kit connecting mechanism 35 is provided to one end of the front mount 32. Further, a stopper member 37 that functions in the same manner as the stopper member 17 is provided in the vicinity of the front-side kit connecting mechanism 35 of the guide surface part 32A.

Furthermore, the guide member 19 is provided on the guide surface part 32A of the front mount 32 at three points along the longitudinal direction.

As shown in FIG. 13 in detail, the front-side kit connecting mechanism 35 has a front-side holding part 32C that is formed by bending one end of the guide surface part 32A at 90 degrees through performing bending processing. This front-side holding part 32C is formed on the opposite side from the mount part 32B with respect to the guide surface part 32A.

The positioning pin 16 is provided by being extruded towards the outside at both ends in the height direction of the front-side holding part 32C.

An engaging device for engaging the front mount 32 with the mount angle 51A is configured with the front-side holding part 32C and the positioning pins 16.

A front-side angular hole 32D in a same shape as that of the front-side angular hole 12D is opened in the vicinity of the front-side holding part 32C of the front mount 32. This front-side angular hole 32D is covered by the stopper member 37.

As described above, the stopper member 37 of this exemplary embodiment has a different shape from that of the stopper member 17 of the first exemplary embodiment.

As in the case of the stopper member 17, the stopper member 37 is formed by a plate spring member. As shown in FIG. 15, it is formed by having a fixed end that is fixed to the guide surface part 32A via a rivet 18, a flat surface 37A extended from the fixed end towards the holding part 32C side, and a part that is bent towards the mount angle 51A side from a position passed over the front-side holding part 32C on an extended line of the flat surface 37A.

A tip end part of one side of the mount angle 51C is engaged between the bent part, the extended line of the flat surface 37A, and the front-side holding part 32C, and it forms a locking part 37D that is locked to the mount angle 51A. Further, in the locking part 37D, an engaging projection part 37C formed by being projected towards the front-side holding part 32C side by being bent from the locking part 37D is continuously provided. This engaging projection part 37C is engaged with the tip end part of one side of the mount angle 51C when the front mount 32 is shifted towards the mount angle 51A side, and it is shifted to the front-side angular hole 32D by being pushed by the tip end part of that one side.

As described above, the front-side angular hole 32D is formed to tolerate the movements of the stopper member 37, and both the front-side angular hole 32D and the stopper member 37 together configure a locking device which locks the front mount 32 to the mount angle 51C.

A slope guide part 37B sloping towards a tip operating part 37E that is a connection releasing mechanism of the stopper member 37 is continued from the tip projection part of the engaging projection part 37C. This slope guide part 37B is formed to guide the tip end part of one side of the mount angle 51C to the engaging projection pall 37C, when shifting the front mount 32 to the mount angle 51C side.

The tip operating part 37E that is slightly bent from the guide part 37B towards the front-side angular hole 32D side continues from the tip end of the slope guide part 37B. Further, the locking part 37D, the engaging projection part 37C, the slope guide part 37B, and the tip operating part 37E are provided by being extended out towards the outer side from the front-side holding part 32C by going over the front-side angular hole 32D of the front-side holding part 32C continued from the guide surface part 32A.

That is, the tip operating part 37E can be operated from the outer side of the mount angle 51C as well as the outer side of the rack 50 when the front mount 32 is connected to the mount angle 51C.

Note here that the front-side kit connecting mechanism 35 of the first kit 31 is configured with the front-side holding part 32C, the positioning pin 16, the front-side angular hole 32D, and the stopper member 37.

As shown in FIG. 13, the rear mount 33 has a slide surface 33A, and slide rail parts 33E and 33F are formed, respectively, at the top and bottom end parts of the slide surface 33A in the width direction.

The slide rail parts 33E and 33F of the rear mount 33 are guided to the guide surface 32A and the guide member 19 of the front mount 32, so that the rear mount 33 is freely slidable towards an arrow A direction. Therefore, the width of the rear mount 33 is formed to be narrower than the width of the front mount 32.

A part corresponding to the mount part 32B of the front mount 32 is not formed in the rear mount 33.

A rear-side kit connecting mechanism 35A is provided at the end part of the slide surface 33A of the rear mount 33, which is at the end part on the opposite side from the front mount 32.

That is, as shown in FIG. 16 in detail, the rear-side kit connecting mechanism 35A is completely in the same structure as that of the front-side kit connecting mechanism 35, except that the attaching directions thereof is different. A rear-side holding part 33C is formed at the end part of the slide surface 33A of the rear mount 33, and the positioning pins 16 are provided on the outer surface of the rear-side holding part 33C by being projected towards the outer side formed in both end parts of the height direction. Further, a rear-side angular hole 33D in the same shape as that of the front-side angular hole 13D is opened in the vicinity of the end part of the rear-side holding part 33C side of the slide surface 33A, and the stopper member 37 is provided to cover the rear-side angular hole 33D.

The rear-side stopper member 37 is in the same shape as that of the front-side stopper member 37 except that the facing direction thereof is different. Therefore, the same reference numerals are applied.

Note here that the rear-side kit connecting mechanism 35A is configured with the rear-side holding part 33C, the positioning pin 16, the front-side angular hole 33D, and the stopper member 37.

As shown in FIG. 13, the second kit 41 of the second exemplary embodiment is formed in bilateral symmetry with the first kit 31 as described above, and disposed to oppose to each other. That is, as described above, both the second kit 41 and the first kit 31 are substantially in the same structure except that the facing direction of the second kit 41 is different from that of the first kit 31. The second kit 41 is configured with a front mount 42 and a rear mount 43 that is freely slidable with respect to the front mount 42.

Note here that the front mount 42 is formed with a guide surface part 42A and a mount part 42B, and it is in the same structure as that of the front mount 32 of the first kit 31. The mount part 42B of the front mount 42 of the second kit 41 opposes to the mount part 32B of the front mount 32 of the first kit 31, and the rack loaded device 60 can be placed and held on the top face of the both mount parts 32B and 42B.

A front-side kit connecting mechanism 45 in the same structure as that of the front-side kit connecting mechanism 35 of the first kit 31 is provided to one end of the front mount 42. Further, the stopper member 37 is provided in the vicinity of the front-side kit connecting mechanism 25 of the guide surface part 42A.

Furthermore, the guide member 19 is provided at three points along the longitudinal direction of the guide surface part 42A of the front mount 42.

The rear-side holding part 43D of the rear mount 43 and the rear-side holding part 33D of the rear mount 33 of the first kit 31 are completely in the same structure except that the facing direction of the rear-side holding part 43D is different from that of the rear-side holding part 33D. A rear-side kit connecting mechanism 45A in the same structure as that of the rear-side kit connecting mechanism 35A of the first kit 31 is provided to an end part of the rear mount 43. Further, the stopper member 37 is provided at an end part of the slide surface part 43A on the rear-side kit connecting mechanism 45A side.

The rear-side stopper member 37 is in the same shape as that of the front-side stopper member 37 except that the facing direction thereof is different. Therefore, the same reference numerals are applied.

Next, a procedure for connecting and locking the front mount 32 of the first kit 31 to one mount angle 51A will be described by referring to FIG. 17-FIG. 19 among the operations of attaching the device 30 of the second exemplary embodiment to the rack 50.

Figure 17A:
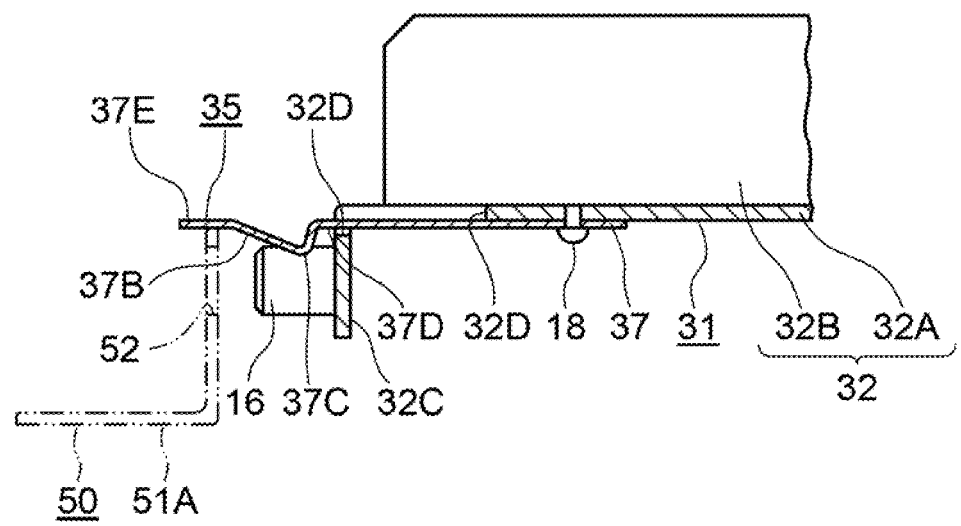
FIG. 17A is an illustration of a first state showing a process when connecting the front mount of the second exemplary embodiment to a mount angle.

For attaching the front mount 32 to one mount angle 51A of the rack 50, first, the end part of the front mount 32 on the kit connecting mechanism 35 side is brought closer to the mount angle 51A as shown in FIG. 17A.

At this time, the length of the first kit 31 is set to be almost conformed to the distance between the mount angles 51A and 51B of the rack mount 50 by relatively sliding the front mount 32 and the rear mount 33.

Then, the inner surface of the tip operating part 37E of the stopper member 37 is pressed against the tip end of one side of the mount angle 51A.

Figure 17B:
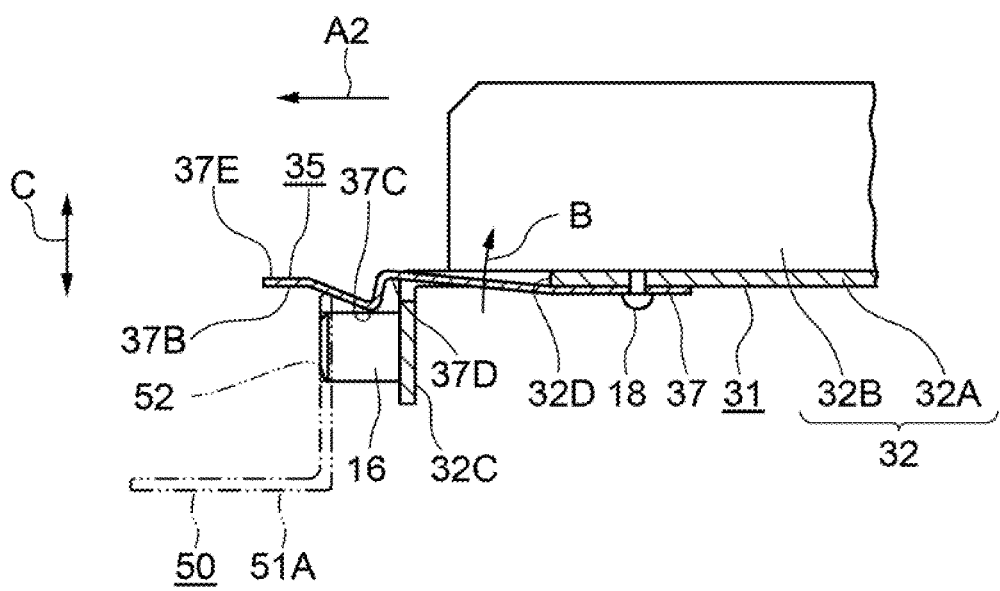
FIG. 17B is an illustration showing a second state.

Thereafter, while keeping that state, the front mount 32 is shifted to an arrow A2 direction as shown in FIG. 17B. With this, the slope guide part 37B of the stopper member 37 provided to the front mount 32 is pressed by the tip end of one side of the mount angle 51A, so that the slope guide part 37B and the like are shifted within the front-side angular hole 32D as shown with an arrow B by having the proximal end part of the stopper member 37 and the front-side angular hole 32D as the center.

At this time, the positioning pin 16 is inserted to the positioning hole 52 of the mount angle 51A. This makes it possible to restrict the movements in an arrow C direction that is orthogonal to the moving direction of the front mount 32 as well as the first kit 31.

Figure 18A:
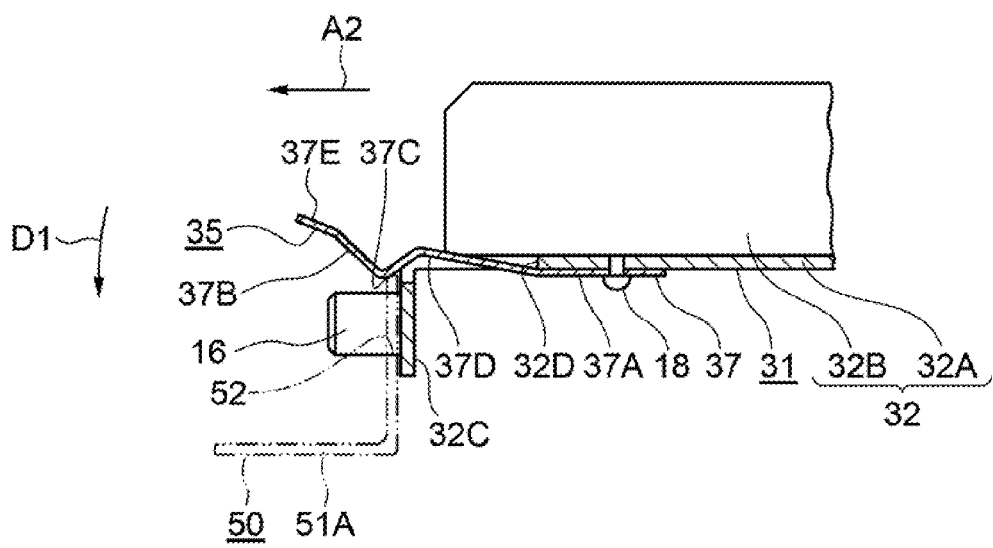
FIG. 18A is an illustration of a third state showing a process when connecting the front mount of the second exemplary embodiment to a mount angle.

Further, as shown in FIG. 18A, when the front mount 32 is further shifted towards the arrow A2 direction, the positioning pin 16 is completely inserted into the positioning hole 52 of the mount angle 51A of the rack 50. In the meantime, the tip end of one side of the mount angle 51A goes over the engaging projection part 37C and enters into the locking part 37D.

Figure 18B:
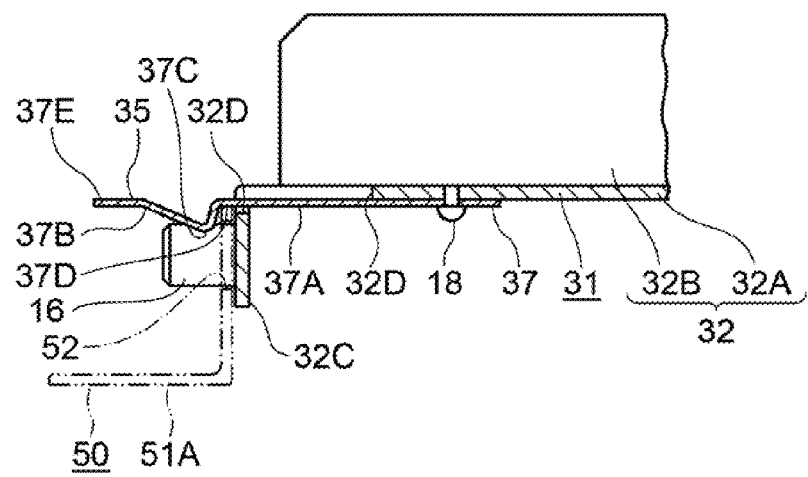
FIG. 18B is an illustration showing a fourth state.

Upon this, the slope guide part 37B, the engaging projection part 37C, and the tip operating part 37E of the stopper member 37 return to the state of the initial positions from the state being pressed towards the front-side angular hole 32D because of the restoring force of the plate spring member and, as shown in FIG. 18B, the engaging projection part 37C works as a stopper of the tip end of one side of the mount angle 51A. As a result, the first kit 31 is connected to the mount angle 51A, i.e., the rack 50.

When detaching the first kit 31 from the rack 50, it is detached in a manner as shown in FIG. 19A.

That is, first, the rack loaded device 60 loaded on the first kit 31 and the second kit 41 is detached from the both kits 31 and 41. Then, the tip operating part 37E of the stopper member 37 is pressed towards an arrow D2 direction to release the locked state between the locking part 37D of the stopper member 37 and the tip end of one side of the mount angle 51A. Then, the front mount 32 is shifted towards the arrow A2 direction.

Upon this, the positioning pin 16 of the front mount 32 is pulled off from the positioning hole 52 of the mount angle 51A to be substantially in the same state that is shown in FIG. 18A. Thereafter, through shifting the front mount 32 towards the arrow A1 direction, i.e., a direction away from the mount angle 51A, detachment of the front mount 32 can be completed. Thereby, the connection between the front mount 32 and the mount angle 51A is released.

While the procedure for attaching the front mount 32 of the first kit 31 has been described, the procedure for attaching the rear mount 33 to the mount angle 51B is also the same except that the shifting direction of the rear mount 33 is inverted from the above case, and the effects thereof are completely the same as those of the front mount 32.

Figure 14:
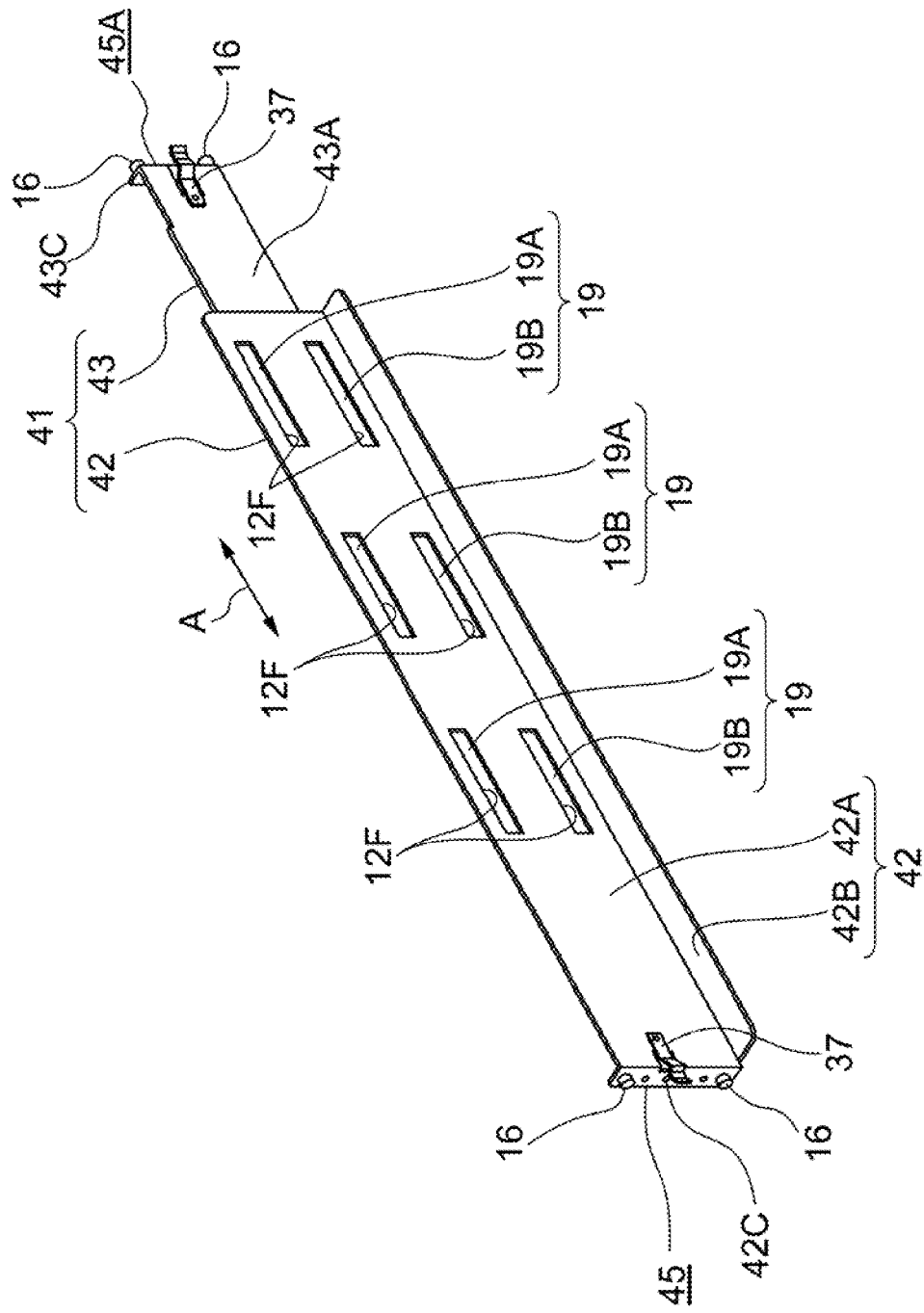
FIG. 14 is an overall perspective view showing a second kit of the second exemplary embodiment.

That is, the stopper member 37 and the like are functionalized by bringing the kit connecting mechanism 35A side of the rear mount kit 33 shown in FIG. 14 and FIG. 16 closer to the mount angle 51B so as to attach the rear mount 33 to the mount angle 51B. Further, the stopper member 37 and the like are functionalized to separate the rear-side kit connecting mechanism 35A side from the mount angle 51B to detach the rear mount 33 from the mount angle 51B so as to release the connection between the rear mount 33 and the mount angle 51B.

Figure 19:
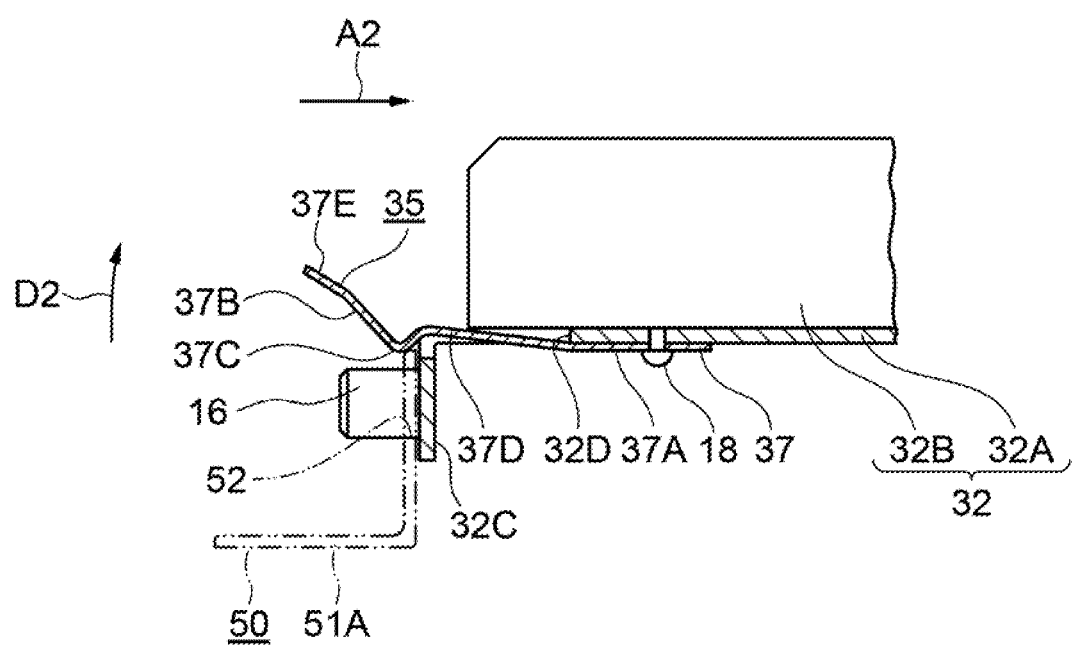
FIG. 19 is an illustration of a fifth state showing a process when connecting the front mount of the second exemplary embodiment to a mount angle.

While FIG. 17-FIG. 19 have been used to describe the procedure for connecting the front mount 32 of the first kit 31 to the mount angle 51A, the procedure for connecting the second kit 41 to the mount angles 51C is also the same as the procedure shown in FIG. 17-FIG. 19.

With the second exemplary embodiment described above, substantially the same effects as those described in (1)-(7) can be achieved.

It is to be understood that the present invention is not limited to each of the above-described exemplary embodiments, and that the present invention includes all such modifications, improvements, and the like, which fall within the scope that is capable of achieving the exemplary object of the present invention.

For example, while the stopper members 17 and 37 are attached via the rivet 18 in each of the above-described embodiments, it is not intended to be limited to such case. Those members may also be attached by spot welding or the like.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The mount rack device of the present invention can be utilized when connecting a rack mount device equipped with a rack loaded device such as an electronic device or the like to a rack or when releasing the connection.

What is claimed is:
1. A rack mount device, comprising:
a first and a second mount kit for holding a loaded device, which are arranged to oppose each other in a lateral direction;
wherein each of the first and second mount kits are detachably mounted to a corresponding pair of front and rear pole brace members; wherein each of the mount kits includes a front mount and a rear mount which abut each other and are telescopically slidable with respect to each other in a longitudinal direction thereof to adjust the length of the respective mount kits; and
a kit connecting mechanism provided at both a front end and a rear end of each of the mount kits, for connecting each of the mount kits to the corresponding pole brace members, and an elongated stopper member provided at both respective ends of each of the mount kits,
wherein the elongated stopper has a proximal end and an opposite distal end; wherein the distal end of the stopper member comprises a slanted tip operating part that acts as a kit connection releasing mechanism for detaching the mount kits from the respective pole brace members;
wherein each of the respective kit connecting mechanisms each comprise:
a holding part formed by bending an end part of a corresponding outer side surface of the respective front and rear mounts, in such a manner that each holding part extends perpendicularly from the corresponding outer side surfaces of the respective front and rear mounts,
wherein the outer side surface of the front mount is a guide surface and the outer surface of the rear mount is a slide surface;
a positioning pin fixed to an inner-side face of the holding part;
wherein the positioning pin is adapted to be inserted through a positioning hole provided in a side of the respective pole brace members, and
a generally L-shaped opening formed in a tip end of both the front and rear mounts; wherein the generally L-shaped opening extends between an inner edge of the outer side surfaces of the respective front and rear mounts and a corresponding inner edge of the holding parts of the respective front and rear mounts; wherein the L-shaped opening is formed at a substantially central height of the respective outer side surfaces and holding parts of the corresponding front and rear mounts in a vertical direction;
wherein the elongated stopper member is formed with an elastic member comprised of a single plate spring; wherein the proximal end of the elongated stopper member is attached to each of the outer side surfaces of the corresponding front and rear mounts by a fastener which extends perpendicularly through the stopper member and the respective outer side surfaces of the corresponding front and rear mounts; wherein the slanted tip operating part of the stopper member is free to pivot in a direction away from the respective positioning pin of a corresponding front or rear mount; wherein the stopper member further includes a generally V-shaped engaging part that is located near the distal end of the stopper member; wherein the V-shaped engaging part projects away from the L-shaped opening; wherein the stopper member further comprises a generally flat locking part located in between the V-shaped engaging part and the slanted tip operating part; wherein the stopper member substantially covers the L-shaped opening;
wherein, when in use, the respective front or rear mount is moved in a first longitudinal direction and the corresponding positioning pin is aligned and inserted within a corresponding positioning hole of a respective pole brace member; wherein the engaging projection part is pressed by the respective pole brace member when the positioning pin is initially inserted within the corresponding positioning hole which causes the engaging projection part, the locking part, and the tip operating part to shift simultaneously towards the L-shaped opening; wherein the engaging projection part, the locking part, and the tip operating part simultaneously return to an initial position when the positioning pin is completely inserted through the corresponding positioning hole; and the tip operating part, locking part, and engaging projection part curve around a tip end portion of the respective pole brace member to lock the corresponding front or rear mount to the respective pole brace member; wherein the tip operating part can be manually shifted towards the L-shaped opening by a user so that the tip operating part, locking part, and engaging projection part temporarily disengages the tip end portion of the respective pole brace member in order to move the respective front or rear mount in a second longitudinal direction which is opposite to the first longitudinal direction which removes the corresponding front or rear mount from the respective pole brace member.

2. The rack mount device as claimed in claim 1, wherein each of front mounts from the first and second mount kits further comprise a holding surface for holding the loaded device, which is orthogonal to the height or vertical direction of the corresponding front mount and extended towards the respective opposing front mount out of the corresponding first and second mount kits.

* * * * *